(12) United States Patent
Ishikawa

(10) Patent No.: US 12,720,934 B2
(45) Date of Patent: Aug. 25, 2026

(54) LIGHT-EMITTING DEVICE INCLUDING LIGHT SOURCE, CONTROL MEMBER, WIRE, AND RESIN MEMBER

(71) Applicant: NICHIA CORPORATION, Anan (JP)

(72) Inventor: Tetsuya Ishikawa, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 384 days.

(21) Appl. No.: 18/357,729

(22) Filed: Jul. 24, 2023

(65) Prior Publication Data

US 2024/0038955 A1 Feb. 1, 2024

(30) Foreign Application Priority Data

Jul. 29, 2022 (JP) ................................ 2022-121865

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .. H10H 20/857; H10H 20/01; H10H 20/0363; H10H 20/0364; H10H 20/854; H10H 20/856; H01L 25/0753; F21V 19/0025; F21V 21/002; F21K 9/20; F21K 9/90; F21Y 2115/10
See application file for complete search history.

(56) References Cited

U.S. PATENT DOCUMENTS 7,579,629 B2 * 8/2009 Inoguchi ................. H01L 24/97 257/98
10,468,558 B2 11/2019 Baek et al.
11,757,078 B2 * 9/2023 Ozeki .................. H10H 20/854 257/98
2017/0154880 A1 6/2017 Ozeki et al.
2019/0035986 A1 1/2019 Maeda
2019/0131208 A1 5/2019 Feichtinger et al.
2019/0214528 A1 7/2019 Ide et al.
(Continued)

FOREIGN PATENT DOCUMENTS

JP 2011-134829 A 7/2011
JP 2014-139979 A 7/2014
(Continued)

*Primary Examiner* — Tan N Tran
(74) *Attorney, Agent, or Firm* — Foley & Lardner LLP

(57) ABSTRACT

A manufacturing method of a light-emitting device includes: providing a light source comprising: a plurality of light-emitting units, a support substrate comprising, on a first upper surface: a plurality of first terminal portions electrically connected with respective ones of the light-emitting units, each comprising a plurality of terminals, and one or more first wire-connecting portions, and a light-reflective member covering the plurality of light-emitting units and comprising a recess in which one or more first wire-connecting portions are exposed from the light-reflective member; providing a control unit comprising, on a second upper surface: a first region where the light source is to be disposed, and one or more second wire-connecting portions disposed in a second region other than the first region; disposing the light source in the first region; and connecting the first and second wire-connecting portions with a first wire.

7 Claims, 19 Drawing Sheets

(56) References Cited

U.S. PATENT DOCUMENTS

| | | | |
|---|---|---|---|
| 2019/0385993 A1 | 12/2019 | Ozeki et al. | |
| 2020/0279981 A1 | 9/2020 | Maeda | |
| 2021/0020621 A1 | 1/2021 | Ozeki et al. | |
| 2021/0091051 A1* | 3/2021 | Ishii | H10H 20/84 |
| 2022/0123180 A1 | 4/2022 | Maeda | |
| 2022/0209079 A1 | 6/2022 | Yamaoka et al. | |
| 2022/0302098 A1 | 9/2022 | Ozeki et al. | |

FOREIGN PATENT DOCUMENTS

| | | |
|---|---|---|
| JP | 2015-035532 A | 2/2015 |
| JP | 2017-108092 A | 6/2017 |
| JP | 2017-212301 A | 11/2017 |
| JP | 2019-029366 A | 2/2019 |
| JP | 2019-029478 A | 2/2019 |
| JP | 2019-514226 A | 5/2019 |
| JP | 2019-121703 A | 7/2019 |
| JP | 2021-009898 A | 1/2021 |
| JP | 2021-052049 A | 4/2021 |
| JP | 2022-103030 A | 7/2022 |

* cited by examiner

LIGHT-EMITTING DEVICE INCLUDING LIGHT SOURCE, CONTROL MEMBER, WIRE, AND RESIN MEMBER

CROSS-REFERENCE TO RELATED APPLICATIONS

The present application claims priority under 35 U.S.C. § 119 to Japanese Patent Application No. 2022-121865, filed Jul. 29, 2022, the contents of which are hereby incorporated by reference in their entirety.

BACKGROUND

1. Technical Field

The present disclosure relates to a light-emitting device, a manufacturing method thereof, and a light-emitting module.

2. Description of Related Art

In recent years, a light source that uses a light-emitting element such as a light-emitting diode has been widely used. For example, Japanese Patent Publication No. 2014-139979 and No. 2015-35532 disclose a light source including a plurality of light-emitting elements, in which a white reflective member is filled between adjacent light-emitting elements.

SUMMARY

When the light source disclosed in Japanese Patent Publication No. 2014-139979 and No. 2015-35532 are disposed on a mounting member such as a mounting substrate, for example, a wire bonding technique may be employed to electrically connect the light source and the mounting member with a wire.

An object of the present disclosure is to provide a light-emitting device that can facilitate electrical connection between a light source and a mounting member and a manufacturing method thereof.

A manufacturing method of a light-emitting device according to the disclosure, the manufacturing method including:

preparing a light source including a plurality of light-emitting units, a support substrate including a first upper surface, and the support substrate having, on the first upper surface, a plurality of first terminal portions electrically connected and paired with each of the light-emitting units and each of the plurality of first terminal portions including a plurality of terminals, and one or more first wire-connecting portions, and a light-reflective member covering the plurality of light-emitting units and comprising a recess exposing the one or more first wire-connecting portions from the light-reflective member on the support substrate;

preparing a control unit including a second upper surface, and the control unit, on the second upper surface, a first region where the light source is configured to be disposed and one or more second wire-connecting portions disposed in a second region other than the first region; disposing the light source in the first region of the control unit; and connecting the first wire-connecting portion and the second wire-connecting portion with a first wire.

A light-emitting device according to the disclosure including:

a light source including a plurality of light-emitting units, a support substrate including a first upper surface, and the support substrate having, on the first upper surface, a plurality of first terminal portions electrically connected and paired with each of the plurality of light-emitting units and each of the plurality of first terminal portions including a plurality of terminals, and one or more first wire-connecting portions, and a light-reflective member covering the plurality of light-emitting units and comprising a recess exposing the one or more first wire-connecting portions from the light-reflective member on the support substrate;

a control unit including a second upper surface, and the control unit having, on the second upper surface, a first region where the light source is configured to be disposed and one or more second wire-connecting portions disposed in a second region other than the first region, the light source being disposed on the first region;

a first wire configured to connect the first wire-connecting portion and the second wire-connecting portion; and a first resin member entering the recess and covering the first wire-connecting portion.

The present disclosure can provide a light-emitting device that can facilitate electrical connection between a light source and a mounting member and a manufacturing method thereof.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DESCRIPTION OF EMBODIMENTS

Figure 1A:
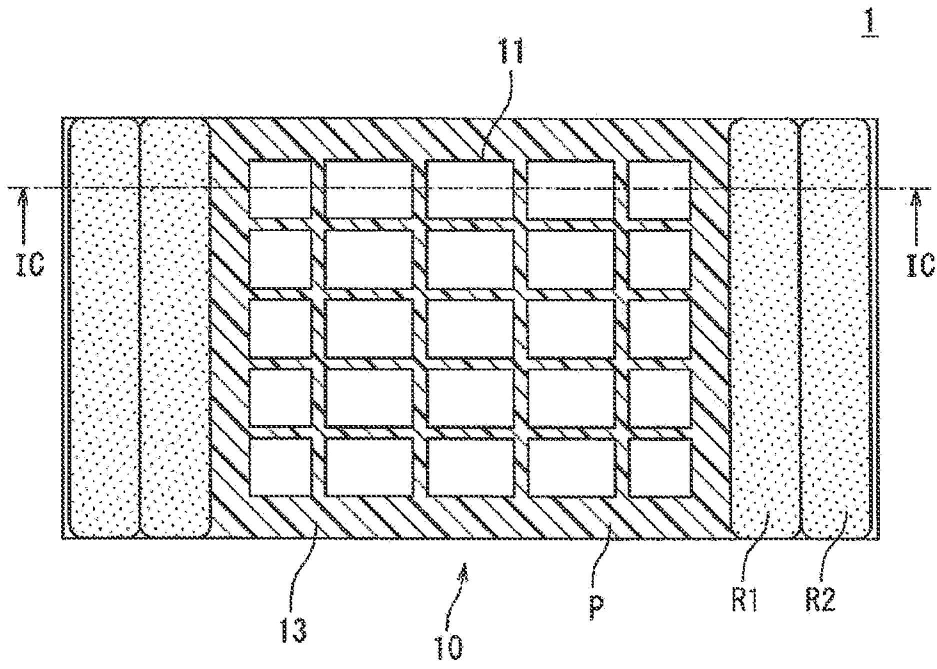
FIG. 1A is a schematic plan view illustrating a light-emitting device according to an embodiment of the present disclosure.

Embodiments of the present disclosure are described below with reference to the drawings. Note that a light-emitting device, a manufacturing method thereof, and a light-emitting module to be described below are merely intended to embody the technical concept of the present disclosure, and the present disclosure is not limited to the following features unless otherwise specified.

In each drawing, members having identical functions may be denoted by the same reference characters. In consideration of explanation of main points or ease of understanding, a plurality of embodiments may be illustrated separately for convenience. Note that partial substitutions or combinations of configurations shown in different embodiments are possible. In the embodiments to be described below, descriptions of matters common to those already described may be omitted, and only different features may be described. In particular, similar effects of similar configurations shall not be mentioned each time for individual embodiments. The size, positional relationship, and the like of members illustrated in the drawings may be exaggerated in order to clarify explanation. As a cross-sectional view, an end view illustrating only a cut surface may be used.

In the following description, terms indicating a specific direction or position (for example, "upper", "lower", and other terms including those terms) may be used. However, these terms are only used to indicate relative directions or positions in the referenced drawing. For example, on the assumption that there are two members, the positional relationship expressed as "upper (or lower)" in the present specification may include a case in which the two members are in contact with each other and a case in which the two members are not in contact with each other and one of the two members is located above (or below) the other member.

Light-Emitting Device

Figure 1B:
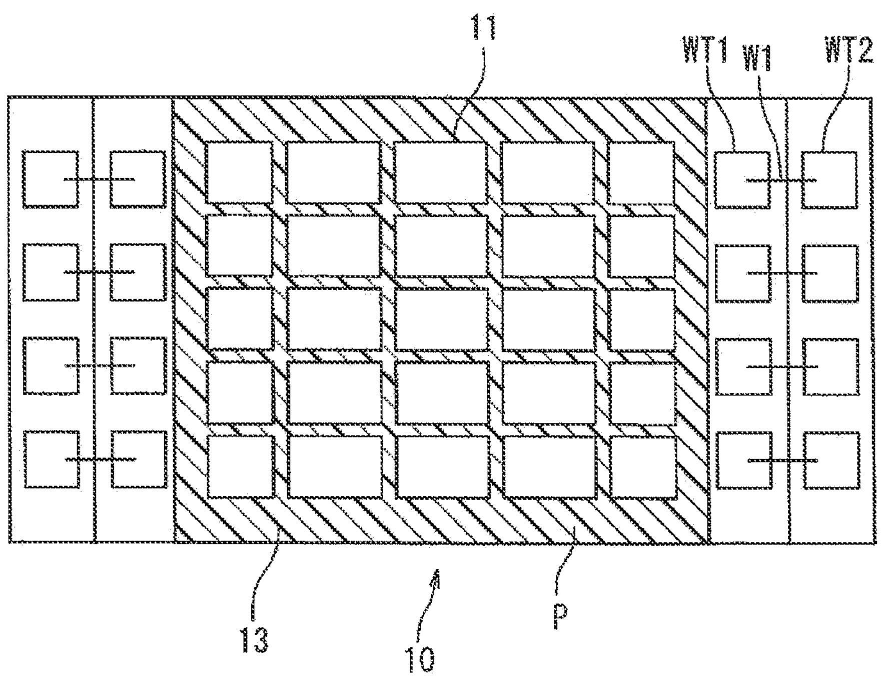
FIG. 1B is a schematic plan view illustrating the light-emitting device in a state in which a first resin member and a second resin member in FIG. 1A are omitted.
Figure 1C:
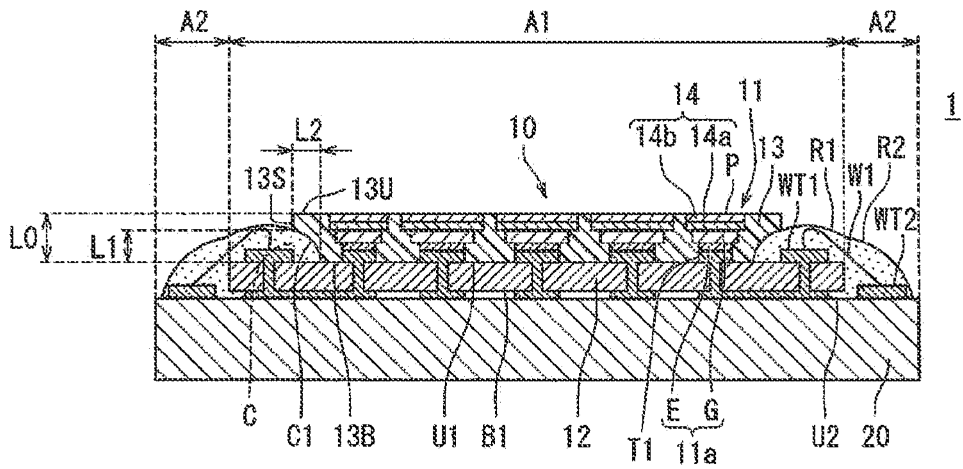
FIG. 1C is a schematic cross-sectional view taken along line IC-IC in FIG. 1A when viewed in an arrow direction.

As illustrated in FIGS. 1A to 1C, a light-emitting device 1 according to an embodiment of the present disclosure includes a light source 10, a control unit 20, first wires W1 electrically connecting the light source 10 and the control unit 20, and a first resin member R1 covering a first wire-connecting portion WT1 on the light source 10. The light-emitting device 1 may further include a second resin member R2 covering a second wire-connecting portion WT2 on the control unit 20. Each of the constituent elements of the light-emitting device 1 is described in detail below.

Light Source

The light source 10 includes a plurality of light-emitting units 11, a support substrate 12 on which the plurality of light-emitting units 11 are disposed, and a light-reflective member 13 covering the plurality of light-emitting units 11. The light source 10 illustrated in FIG. 1A has a light-emitting surface P including light-emitting surfaces of the plurality of light-emitting units 11 on an upper surface of the light source 10, and a lower surface opposite to the upper surface is a mounting surface.

Light-Emitting Unit

The plurality of light-emitting units 11 can be turned on individually or in groups by, for example, the control unit 20 to be described below. As illustrated in FIG. 1A, in a top view, the plurality of light-emitting units 11 are preferably arranged at equal intervals in a first direction and a second direction intersecting the first direction. FIG. 1A illustrates a configuration in which the light-emitting units 11 are arranged in five rows and five columns.

The plurality of light-emitting units 11 may be all connected in series to be turned on at once, or may be connected in parallel to be turned on individually. Alternatively, by combining the series connection and the parallel connection, the plurality of light-emitting units 11 may be turned on for each group in which the light-emitting units 11 are connected in series. For example, by connecting the plurality of light-emitting units 11 in parallel, the light-emitting units 11 can be individually controlled by the control unit 20. Thus, the light-emitting units 11 can be individually turned on at a desired brightness, and the contrast of light emitted from the light source 10 can be improved.

The light-emitting device 1 according to the present embodiment can be used as, for example, a flash light source for an imaging device. The imaging device is mounted on, for example, a mobile communication terminal. When the light-emitting device 1 according to the present embodiment is used as a flash light source for an imaging device, for example, light can be emitted by switching a wide-angle mode in which all the light-emitting units 11 emit light and a narrow-angle mode in which only the light-emitting units 11 located near the center emit light and the light-emitting units 11 located at an outer side emit no light. The narrow-angle mode has a light irradiation angle narrower than the wide-angle mode. Because the light-emitting device 1 can switch irradiation light corresponding to the wide-angle mode and the narrow-angle mode, for example, photographing corresponding to a photographing mode such as close-up photographing or telescopic photographing in the imaging device can be performed.

In the top view, the distance between light-emitting surfaces of adjacent light-emitting units 11 is preferably short. The distance between the light-emitting surfaces of the adjacent light-emitting units 11 is, for example, in a range from 0.01 times to 0.16 times, preferably in a range from 0.02 times to 0.08 times the maximum length of the light-emitting surface of the light-emitting unit 11. The distance between the light-emitting surfaces of the adjacent light-emitting units 11 is, for example, in a range from 10 μm to 200 μm, preferably in a range from 20 μm to 100 μm. By setting the distance between the light-emitting surfaces of the adjacent light-emitting units 11 as described above, a region being a dark portion between the light-emitting units 11 can be reduced.

The light-emitting unit 11 includes a light-emitting element 11*a*. The light-emitting unit 11 may further include a light-transmissive member 14 disposed above the light-emitting element 11*a*. The light-transmissive member 14 is a plate-shaped member having a substantially rectangular shape in the top view and covers an upper surface of the light-emitting element 11*a*. The light-transmissive member 14 includes, for example, at least one selected from the group consisting of a wavelength conversion layer including a wavelength conversion substance, a light diffusion layer including a light diffusion member, and a transparent layer not including a wavelength conversion substance and a light diffusion member. The light-transmissive member 14 includes, for example, a wavelength conversion layer 14*a* and a light diffusion layer 14*b*.

The light-emitting element 11*a* includes a semiconductor structure G and an electrode E. The electrode E includes at least two electrodes, and each electrode serves as an anode electrode or a cathode electrode. In the light-emitting element 11*a* illustrated in FIG. 1C, the electrode E is disposed below the semiconductor structure G. The semiconductor structure G may include a support substrate and a semiconductor layer disposed on the support substrate. In this case, the support substrate, the semiconductor layer, and the electrode E are disposed in this order.

The semiconductor structure G includes an n-side semiconductor layer, a p-side semiconductor layer, and an active layer interposed between the n-side semiconductor layer and the p-side semiconductor layer. The active layer may have a single quantum well (SQW) structure, or may have a multi quantum well (MQW) structure including a plurality of well layers. The semiconductor structure G includes a plurality of semiconductor layers each made of a nitride semiconductor. The nitride semiconductor includes a semiconductor having all compositions in which in a chemical formula of $In_xAl_yGa_{1-x-y}N$ ($0 \leq x$, $0 \leq y$, and $x+y \leq 1$), composition ratios x and y are changed within respective ranges. The light emission peak wavelength of the active layer can be selected as appropriate according to the purpose. The active layer is configured, for example, so as to be able to emit visible light or ultraviolet light.

The semiconductor structure G may include a plurality of light-emitting units each including an n-side semiconductor layer, an active layer, and a p-side semiconductor layer. When the semiconductor structure G includes a plurality of light-emitting units, the plurality of light-emitting units may each include well layers having different light emission peak wavelengths or well layers having the same light emission peak wavelength. Note that having the same light emission peak wavelength includes a case in which there is a variation of about a few nm. The combination of the light emission peak wavelengths of the plurality of light-emitting units can be selected as appropriate. For example, when the semiconductor structure G includes two light-emitting units, combinations of light emitted from the respective light-emitting units include a combination of blue light and blue light, a combination of green light and green light, a combination of red light and red light, a combination of ultraviolet light and ultraviolet light, a combination of blue light and green light, a combination of blue light and red light, or a combination of green light and red light. For example, when the semiconductor structure G includes three light-emitting units, combinations of light emitted from the respective light-emitting units include a combination of blue light, green light, and red light. Each of the light-emitting units may include one or more well layers having light emission peak wavelengths different from the light emission peak wavelengths of other well layers.

The wavelength conversion layer 14*a* converts the wavelength of at least a part of light from the light-emitting element 11*a*. The wavelength conversion layer 14*a* is a plate-shaped member having a substantially rectangular shape in the top view. The wavelength conversion member included in the wavelength conversion layer 14*a* can use, for example, an yttrium aluminum garnet-based phosphor (for example, $(Y, Gd)_3(Al, Ga)_5O_{12}$:Ce), a lutetium aluminum garnet-based phosphor (for example, $Lu_3(Al, Ga)_5O_{12}$:Ce), a terbium aluminum garnet-based phosphor (for example, $Tb_3(Al, Ga)_5O_{12}$:Ce), a CCA-based phosphor (for example, $Ca_{10}(PO_4)_6Cl_2$:Eu), an SAE-based phosphor (for example, $Sr_4Al_{14}O_{25}$:Eu), a chlorosilicate-based phosphor (for example, $Ca_8MgSi_4O_{16}Cl_2$:Eu), a silicate-based phosphor (for example, $(Ba, Sr, Ca, Mg)_2SiO_4$:Eu), an oxynitride phosphor such as a β-sialon-based phosphor (for example, $(Si, Al)_3(O, N)_4$:Eu) or an α-sialon-based phosphor (for example, $Ca(Si, Al)_{12}(O, N)_{16}$:Eu), an LSN-based phosphor (for example, $(La, Y)_3Si_6N_{11}$:Ce), a BSESN-based phosphor (for example, $(Ba, Sr)_2Si_5N_8$:Eu), an SLA-based phosphor (for example, $SrLiAl_3N_4$:Eu), a nitride-based phosphor such as a CASN-based phosphor (for example, $CaAlSiN_3$:Eu) or an SCASN-based phosphor (for example, $(Sr, Ca)AlSiN_3$:Eu), a KSF-based phosphor (for example, $K_2SiF_6$:Mn), a fluoride phosphor such as a KSAF-based phosphor (for example, $K_2(Si_{1-x}Al_x)F_{6-x}$:Mn, where x satisfies $0<x<1$) or an MGF-based phosphor (for example, $3.5MgO\cdot 0.5MgF_2\cdot GeO_2$:Mn), a quantum dot having a perovskite structure (for example, $(Cs, FM, MA)(Pb, Sn)(F, Cl, Br, I)_3$, where FA and MA represent formamidinium and methylammonium, respectively), a group II-VI quantum dot (for example, CdSe), a III-V quantum dot (for example, InP), a quantum dot having a chalcopyrite structure (for example, $(Ag, Cu)(In, Ga)(S, Se)_2$), or the like.

Examples of the wavelength conversion layer 14*a* include those obtained by containing the above wavelength conversion member in a resin material, ceramics, glass, or the like, and a sintered body of a wavelength conversion member. Examples of the wavelength conversion layer 14*a* may include those obtained by disposing a resin layer containing a wavelength conversion member on one surface of a molded article made of a resin material, ceramics, and glass.

When white light is emitted from the plurality of light-emitting units 11, the light-emitting element 11*a* that emits blue light and the wavelength conversion layer 14*a* including a wavelength conversion member that emits yellow light by the light from the light-emitting element 11*a* can be combined, for example.

The light diffusion layer 14*b* diffuses light entering the inside of the light diffusion layer 14*b*. The light diffusion layer 14*b* is a plate-shaped member having a substantially rectangular shape in the top view. The light diffusion layer 14*b* covers an upper surface of the wavelength conversion layer 14*a*. The light diffusion layer 14*b* can use, for example, those obtained by containing a light diffusion member, such as titanium oxide, barium titanate, aluminum oxide, or silicon oxide, in a resin material. The planar shape of the light diffusion layer 14*b* in the present embodiment is the same as the planar shape of the wavelength conversion layer 14*a*. Note that the planar shape of the light diffusion layer 14*b* may be larger or smaller than the planar shape of the wavelength conversion layer 14*a*.

When the light-transmissive member 14 includes the wavelength conversion layer 14*a* and the light diffusion layer 14*b*, the light diffusion layer 14*b* may include a wavelength conversion member instead of or in addition to a light diffusion member. That is, the wavelength conversion layer 14*a* and the light diffusion layer 14*b* may each contain a wavelength conversion member. Preferably, the light diffusion layer 14*b* includes a wavelength conversion member that emits light having a light emission peak wavelength in a range from 450 nm to 480 nm. As such a wavelength conversion member, for example, $(Sr, Ca)_2MgSi_2O_8$:Eu or $Ca_{10}(PO_4)_6Cl_2$:Eu can be used. In a case in which the above wavelength conversion member is contained in the light diffusion layer 14*b* located on the outermost surface of the light-emitting unit 11, the body color of the light diffusion layer 14*b* in the top view is likely to be a white color when the light sources 10 emits no light. Thus, for example, when the body color of the light-reflective member 13 to be described below is a white color, the color of the entire upper surface of the light source 10 during non-emission can be a similar color (white color). As a result, for example, when the light-emitting device 1 is viewed from the outside, the appearance of the light-emitting device 1 can be improved. When the light-emitting element 11*a* that emits blue light is used, the emission spectrum of the light-emitting device may have a region with low relative emission intensity in a wavelength range from 465 nm to 480 nm, for example. On the other hand, when the light diffusion layer 14*b* includes a wavelength conversion member that emits light having a light emission peak wavelength in a range from 450 nm to 480 nm, the relative emission intensity of a region having a low relative emission intensity can be increased in the emission spectrum of the light-emitting device 1. Thus, the luminous flux of the light-emitting device 1 tends to increase. The wavelength conversion member included in the light diffusion layer 14*b* also has an effect of diffusing light incident on the light diffusion layer 14*b*.

In the top view, an outer edge of the light-transmissive member 14 may coincide with an outer edge of the light-emitting element 11*a*, or may be located outside the outer edge of the light-emitting element 11*a*. This makes it possible to reduce the possibility that light emitted from the light-emitting element 11*a* is extracted to the outside without passing through the light-transmissive member 14. Note that in the top view, the outer edge of the light-transmissive member 14 may be located inside the outer edge of the light-emitting element 11*a*.

Support Substrate

The support substrate 12 is a substrate on which the plurality of light-emitting units 11 can be disposed. The support substrate 12 includes, for example, a base material including an insulating material and a wiring line disposed on a surface of the base material. The support substrate 12 may further have a part of a wiring line therein.

The support substrate 12 includes an upper surface (first upper surface U1). The support substrate 12 includes a plurality of first terminal portions T1 and one or more first wire-connecting portions WT1 on the first upper surface U1. The first terminal portion T1 and the first wire-connecting portion WT1 are a part of the wiring line. The first terminal portion T1 includes a plurality of terminals, and is paired with and electrically connected to the light-emitting unit 11. Each light-emitting unit 11 is disposed on the pair of first terminal portions T1, and the electrode E of each light-emitting unit 11 is electrically connected to the terminal of the first terminal portion T1. The electrode E of each light-emitting unit 11 and the terminal of the first terminal portion T1 are electrically connected to each other via a conductive member such as silver paste. The terminals of the first terminal portions T1 are, for example, a positive terminal and a negative terminal.

The first wire-connecting portion WT1 is a wiring portion to which one end of a first wire W1 to be described below is connected. The first wire-connecting portion WT1 is electrically connected to a second wire-connecting portion WT2 of the control unit 20 to be described below by the first wire W1. Thus, current output from the control unit 20 can be supplied to the support substrate 12, and the light-emitting elements 11*a* included in the plurality of light-emitting units 11 in the light source 10 can be turned on individually or in groups.

Figure 2A:
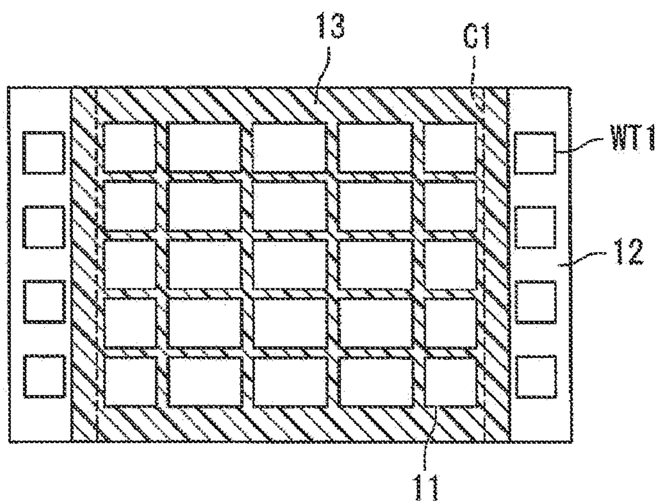
FIG. 2A is a schematic plan view for explaining a recess of the light-emitting device according to an embodiment of the present disclosure.

The first wire-connecting portions WT1 may be disposed in rows at positions facing each other so as to interpose the plurality of first terminal portions T1 in the top view. In FIG. 2A, four first wire-connecting portions WT1 are disposed in rows. In FIG. 2A, for convenience of illustration, the control unit 20, the first wire W1, the first resin member R1, and the like are omitted, and the first wire-connecting portion WT1 and a part of the support substrate 12 are visualized. The arrangement and the number of the first wire-connecting portions WT1 are not limited to those described above as long as current is appropriately supplied to each light-emitting unit 11.

Preferably, an insulating material is used as the base material of the support substrate 12. Preferably, the support substrate 12 uses a material that does not easily transmit light emitted from the light-emitting unit 11, external light, or the like and has a certain mechanical strength. Specifically, the support substrate 12 can be formed using, as the base material, ceramics such as aluminum oxide, aluminum nitride, mullite, and silicon nitride, and resin such as phenol resin, epoxy resin, polyimide resin, bismaleimide triazine (BT) resin, and polyphthalamide.

As the wiring line including the first terminal portion T1 and the first wire-connecting portion WT1, a member including at least one of copper, iron, nickel, tungsten, chromium, aluminum, silver, gold, titanium, palladium, rhodium, or an alloy thereof, for example, can be used.

Light-Reflective Member

The light-reflective member 13 has reflectivity to light emitted from the light-emitting unit 11. The light-reflective member 13 covers lateral surfaces of the plurality of light-emitting units 11 so that upper surfaces of the plurality of light-emitting units 11 are exposed. The light-reflective member 13 is disposed between adjacent light-emitting units 11. By disposing the light-reflective member 13 between the light-emitting units 11, overlapping of light emitted from one light-emitting unit 11 and light emitted from an adjacent light-emitting unit 11 can be reduced. Thus, for example, when one light-emitting unit 11 emits light and an adjacent light-emitting unit 11 emits no light, entrance of the light emitted from the one light-emitting unit into the adjacent light-emitting unit 11 side can be reduced. As a result, a light-emitting device having a high contrast can be implemented.

In the light-emitting device 1 according to the present embodiment, the light-reflective member 13 covers lateral surfaces of the light-emitting elements 11*a*, lateral surfaces of the wavelength conversion layers 14*a*, and lateral surfaces of the light diffusion layers 14*b*. On the light-emitting surface of the light-emitting unit 11, an upper surface of the light diffusion layer 14*b* is exposed from the light-reflective member 13. The light-emitting surface is a primary light extraction surface. The light-reflective member 13 further covers the lateral surfaces and the lower surface of the semiconductor structure G of the light-emitting element 11*a*. The light-reflective member 13 covers the lateral surfaces of the electrode E of the light-emitting element 11*a*. A lower surface of the electrode E is exposed from the light-reflective member 13.

In the top view, the distance between the light-emitting surfaces of adjacent light-emitting units 11 (width of the light-reflective member 13) is, for example, in a range from 0.01 times to 0.16 times, preferably in a range from 0.02 times to 0.08 times the maximum length of the light-emitting surface of the light-emitting unit 11. The distance between the light-emitting surfaces of the adjacent light-emitting units 11 is, for example, in a range from 10 μm to 200 μm, preferably in a range from 20 μm to 100 μm. Thus, in the top view, a light-emitting module having a high contrast while reducing the size of the light-emitting device 1 can be implemented.

The light-reflective member 13 includes a recess C1 in which one or more first wire-connecting portions WT1 on the support substrate 12 are exposed. Because the first wire-connecting portion WT1 is not covered by the light-reflective member 13, the first wire W1 can be easily connected to the first wire-connecting portion WT1. In the light-emitting device 1 according to the present embodiment, the light-reflective member 13 is spaced from the first wire-connecting portion WT1 as illustrated in FIG. 1C. The light-reflective member 13 further includes an upper surface 13U, a lower surface 13B located on the opposite side of the upper surface 13U, and an outer lateral surface 13S connecting the upper surface 13U and the lower surface 13B. The recess C1 of the light-reflective member 13 includes an opening C provided continuously to the lower surface 13B and the outer lateral surface 13S of the light-reflective member 13. The opening C illustrated in FIG. 1C does not reach the upper surface 13U of the light-reflective member 13. Thus, when a resin material forming the first resin member R1 is disposed in the recess C1, creeping-up of the resin material forming the first resin member R1 onto the light-emitting surface P of the light source 10 can be reduced. As a result, an unintentional influence of the first resin member R1 on the orientation of the light source 10 can be suppressed.

In the present embodiment, as illustrated in FIG. 1C, the recess C1 of the light-reflective member 13 is provided on the outer lateral surface 13S on the side where the first wire-connecting portion WT1 is formed. The recess C1 is deep in a direction inward from the outer lateral surface 13S of the light-reflective member 13 from the upper surface 13U side to the lower surface 13B side of the light-reflective member 13. A maximum length L1 in a height direction at the opening C of the recess C1 is, for example, in a range from 0.3 times to 0.9 times, preferably in a range from 0.5 times to 0.9 times a length L0 from the upper surface 13U to the lower surface 13B of the light-reflective member 13. A maximum length L2 at the opening C of the recess C1 in the direction inward from the outer lateral surface 13S is, for example, in a range from 0.3 times to 5 times, preferably in a range from 0.5 times to 2 times the length L0 from the upper surface 13U to the lower surface 13B of the light-reflective member 13. The maximum length L2 may be greater than the maximum length L1.

The first resin member R1 to be described below enters the recess C1. Because the light-reflective member 13 includes the recess C1 having the opening C that does not reach the upper surface 13U, creeping-up of the first resin member R1 onto the light-emitting surface P of the light source 10 can be reduced. Thus, an influence on the orientation of the light source 10 due to the creeping-up of the first resin member R1 onto the light-emitting surface P of the light source 10 can be reduced. Furthermore, because the light-reflective member 13 includes the recess C1 on the outer lateral surface 13S, a contact area between the light-reflective member 13 and the first resin member R1 can be increased as compared with a light-emitting device in which the light-reflective member 13 does not include the recess C1. This makes it possible to improve the adhesion between the light-reflective member 13 and the first resin member R1.

Figure 2B:
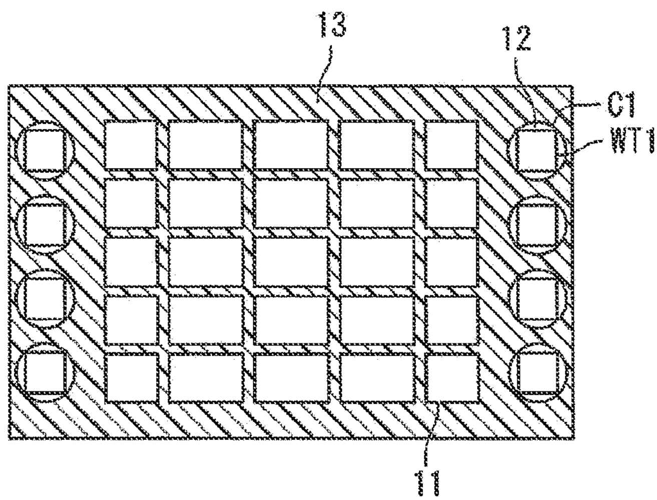
FIG. 2B is a schematic plan view for explaining a modified example of the recess of the light-emitting device according to an embodiment of the present disclosure.
Figure 2C:
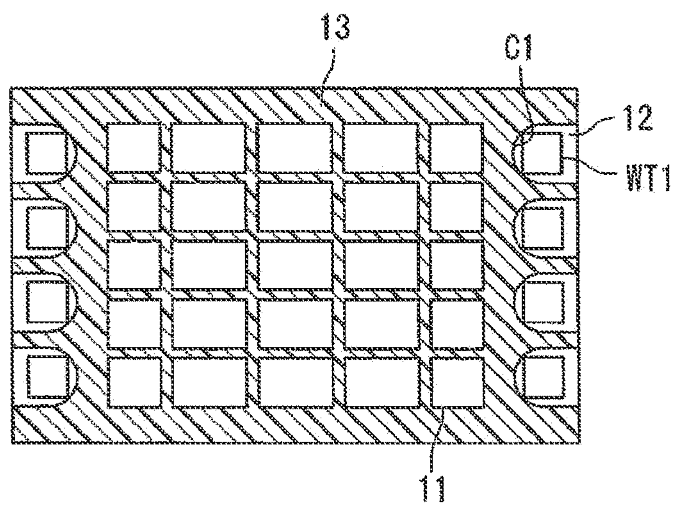
FIG. 2C is a schematic plan view for explaining a modified example of the recess of the light-emitting device according to an embodiment of the present disclosure.

In the light-emitting device 1 in the present embodiment, the recesses C1 of the light-reflective member 13 are disposed in rows along a plurality of first wire-connecting portions WT1 in the top view as illustrated in FIG. 2A. Note that the recess C1 of the light-reflective member 13 is not limited to the above configuration as long as the light-reflective member 13 is located at a position spaced from the first wire-connecting portion WT1. For example, as illustrated in FIG. 2B, the recess C1 of the light-reflective member 13 may be a recess penetrating from the upper surface to the lower surface of the light-reflective member 13. The first wire-connecting portion WT1 and a part of the support substrate 12 are exposed from the light-reflective member 13 on a bottom surface of the recess C1. The recess C1 may be provided individually for each first wire-connecting portion WT1 as illustrated in FIG. 2B, or may be provided for the plurality of first wire-connecting portions WT1. Alternatively, as illustrated in FIG. 2C, the recess C1 of the light-reflective member 13 may be a recess that penetrates from the upper surface to the lower surface of the light-reflective member 13 and reaches the lateral surface of the light-reflective member 13. The first wire-connecting portion WT1 and a part of the support substrate 12 are exposed from the light-reflective member 13 on the bottom surface of the recess C1. In FIGS. 2B and 2C, for convenience of illustration, the control unit 20, the first wire W1, the first resin member R1, and the like are omitted, and the first wire-connecting portion WT1 and a part of the support substrate 12 are visualized.

As the light-reflective member 13, a resin material containing a light-reflective material such as white pigment, for example, can be used. Examples of light-reflective materials include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide. One of these is preferably used alone, or a combination of two or more types thereof are preferably used. As the resin material, a resin material including thermosetting resin such as epoxy resin, silicone resin, silicone-modified resin, and phenol resin as a main component, or a resin material including thermoplastic resin such as polyphthalamide resin, polybutylene terephthalate, and unsaturated polyester as a main component is used as a base material.

Control Unit

The control unit 20 is located below the light source 10, and the light source 10 is disposed on an upper surface (second upper surface U2) of the control unit 20. The control unit 20 controls the plurality of light-emitting units 11 individually or in groups, and may be an IC, for example. Stacking the light source 10 and the control unit 20 in the height direction does not require to secure an area occupied by each of the light source 10 and the control unit 20 on the same mounting surface on a mounting substrate. Thus, a size of the light-emitting device 1 in the top view can be reduced.

The control unit 20 includes a first region A1 and a second region A2 other than the first region A1 on the second upper surface U2. The first region A1 is a region where the light source 10 can be disposed and corresponds to a central region of the control unit 20. The second region A2 corresponds to a region outside the first region A1 and includes a plurality of second wire-connecting portions WT2.

In the light-emitting device 1 according to the present embodiment, the plurality of second wire-connecting portions WT2 are disposed in rows with the plurality of light-emitting units 11 interposed therebetween in the second region A2. The arrangement direction of the plurality of second wire-connecting portions WT2 coincides with the arrangement direction of the plurality of first wire-connecting portions WT1. In FIG. 1B, four second wire-connecting portions WT2 are disposed in rows. Note that the arrangement and the number of the second wire-connecting portions WT2 are not limited to those described above as long as current is appropriately supplied to each light-emitting unit 11.

The first wire-connecting portion WT1 provided on the support substrate 12 and the second wire-connecting portion WT2 provided on the control unit 20 are electrically connected to each other by the first wire W1. Thus, current output from the control unit 20 can be supplied to the support substrate 12, and the light-emitting elements 11*a* included in the plurality of light-emitting units 11 in the light source 10 can be individually turned on.

The second wire-connecting portion WT2 can use the same material as the first wire-connecting portion WT1.

First Wire

The first wire W1 is a member for supplying current output from the control unit 20 to the support substrate 12. The first wire W1 electrically connects the first wire-connecting portion WT1 provided on the support substrate 12 and the second wire-connecting portion WT2 provided on the control unit 20. As the first wire W1, a metal such as gold, copper, silver, platinum, aluminum, and palladium, or an alloy containing one or more types thereof, for example, can be used.

First Resin Member

The first resin member R1 covers the first wire-connecting portion WT1. The first resin member R1 is an insulating resin material, and has light reflectivity, for example. The material of the first resin member R1 may be the same as or different from the material of the light-reflective member 13. The first resin member R1 may be in contact with the surface of the recess C1. By disposing the first resin member R1 in the recess C1, the contact area between the light-reflective member 13 and the first resin member R1 can be increased as compared with a light-emitting device in which the light-reflective member 13 does not include the recess C1. This makes it possible to improve the adhesion between the light-reflective member 13 and the first resin member R1. In the light-emitting device 1 in the present embodiment, the first resin member R1 covers the first wire W1. Because the first resin member R1 covers the first wire W1, for example, when an external force is applied to the light-emitting device 1, the first resin member R1 serves to protect the first wire W1 and has an effect of reducing deformation or the like of the first wire W1. Because the first resin member R1 has light reflectivity, a part of light emitted toward the first wire W1 among return light to the light source 10 is reflected by the first resin member R1 and is easily extracted upward. Because the first resin member R1 covers the first wire W1, the first wire W1 is not easily visually recognized when the light-emitting device 1 is viewed from above, so that the appearance of the light-emitting device 1 can be improved.

Second Resin Member

The light-emitting device 1 may further include the second resin member R2. The second resin member R2 covers the second wire-connecting portion WT2. The second resin member R2 is an insulating resin member like the first resin member R1, and has light reflectivity, for example. The material of the second resin member R2 may be the same as or different from the material of the first resin member R1. In the light-emitting device 1 of the present embodiment, the second resin member R2 covers the first wire W1 and a second wire W2 to be described below. Because the second resin member R2 covers the first wire W1 and the like, for example, when an external force is applied to the light-emitting device 1, the second resin member R2 serves to protect the first wire W1 and the like and has an effect of reducing deformation or the like of the first wire W1 and the like. Because the second resin member R2 has light reflectivity, a part of light emitted toward the first wire W1 or the like among return light to the light source 10 is reflected by the second resin member R2 and is easily extracted upward. Because the second resin member R2 covers the first wire W1 and the second wire W2, the first wire W1 and the second wire W2 are not easily visually recognized when the light-emitting device 1 is viewed from above, so that the appearance of the light-emitting device 1 can be improved. Note that the second wire-connecting portion WT2 may be covered by the first resin member R1 without providing the second resin member WT2.

The upper surfaces of the first resin member R1 and the second resin member R2 may be curved as illustrated in FIG. 1C. In the height direction, the highest position of the second resin member R2 may be lower than the highest position of the first resin member R1. Note that the upper surfaces of the first resin member R1 and the second resin member R2 may be flat surfaces including no curved surface, or may have shapes obtained by combining a flat surface and a curved surface.

Figure 3A:
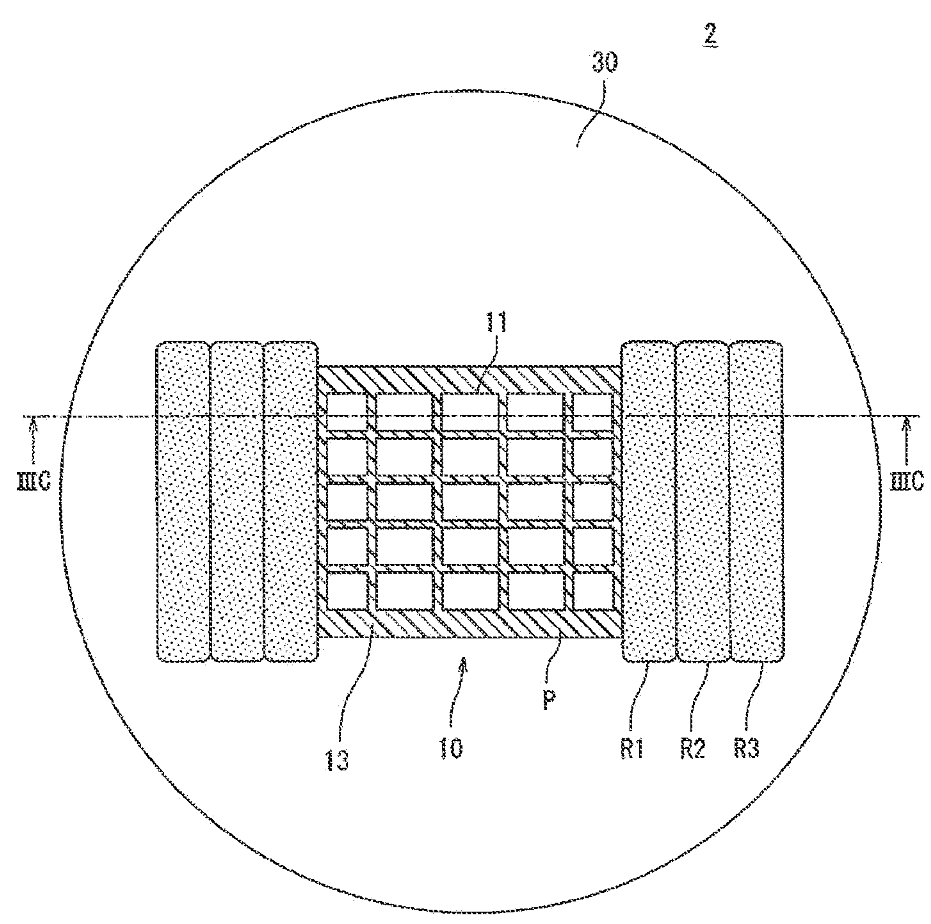
FIG. 3A is a schematic plan view illustrating a light-emitting module according to an embodiment of the present disclosure.

A light-emitting module 2 according to an embodiment of the present disclosure is described below with reference to FIGS. 3A and 3B. The light-emitting module 2 according to an embodiment of the present disclosure includes the light-emitting device 1, a mounting substrate 30 including an upper surface on which the light-emitting device 1 is disposed, and the second wire W2 electrically connecting the light-emitting device 1 and the mounting substrate 30. The light-emitting module 2 may further include the second resin member R2, a third resin member R3, and a lens 60. Each constituent member of the light-emitting module 2 is described in detail below. Note that the light-emitting device 1 is as described above and a description thereof is omitted.

Mounting Substrate

The mounting substrate 30 is disposed below the control unit 20. As the mounting substrate 30, a material that does not easily transmit light emitted from the light source 10, external light, or the like is preferably used. The mounting substrate 30 can be formed using, as a base material, ceramics such as aluminum oxide, aluminum nitride, and mullite, and resin such as phenol resin, epoxy resin, polyimide resin, BT resin, and polyphthalamide.

The mounting substrate 30 is provided with a region where the light-emitting device 1 is disposed on a third upper surface U3 and a region outside the region where the light-emitting device 1 is disposed. One or more third wire-connecting portions WT3 are provided in the region outside the region where the light-emitting device 1 is disposed.

Figure 3B:
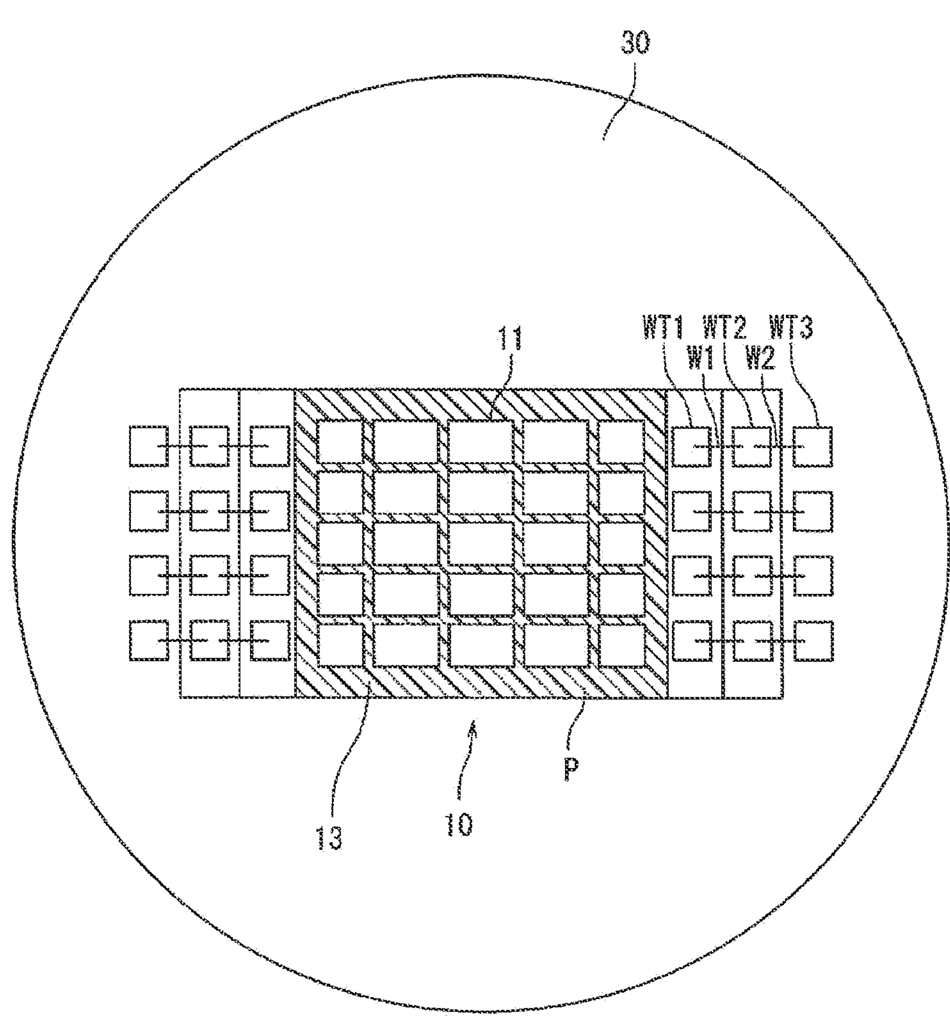
FIG. 3B is a schematic plan view illustrating the light-emitting module in a state in which a first resin member to a third resin member in FIG. 3A are omitted.

As illustrated in FIG. 3B, a plurality of the third wire-connecting portions WT3 may be disposed in rows with the light-emitting device 1 interposed therebetween in a top view. The arrangement direction of the third wire-connecting portions WT3 coincides with, for example, the arrangement direction of the first wire-connecting portions WT1 and the arrangement direction of the second wire-connecting portions WT2.

The one or more third wire-connecting portions WT3 are electrically connected to the second wire-connecting portion WT2 provided on the control unit 20 by the second wire W2. Thus, current can be supplied from the mounting substrate 30 to the control unit 20 by the second wire W2. The third wire-connecting portion WT3 can use the same material as the first wire-connecting portion WT1.

Third Resin Member

The third resin member R3 covers the third wire-connecting portion WT3. Similarly to the first resin member R1 and the second resin member R2, the third resin member R3 is an insulating material for preventing an electrical short circuit with the third wire-connecting portion WT3. The third resin member R3 has light reflectivity, for example. The material of the third resin member R3 may be the same as or different from the material of the first resin member R1 or the second resin member R2. In the light-emitting module 2 of the present embodiment, the third resin member R3 covers a part of the second wire W2. The second wire W2 is covered by a part of the second resin member R2 and a part of the third resin member R3.

Figure 3C:
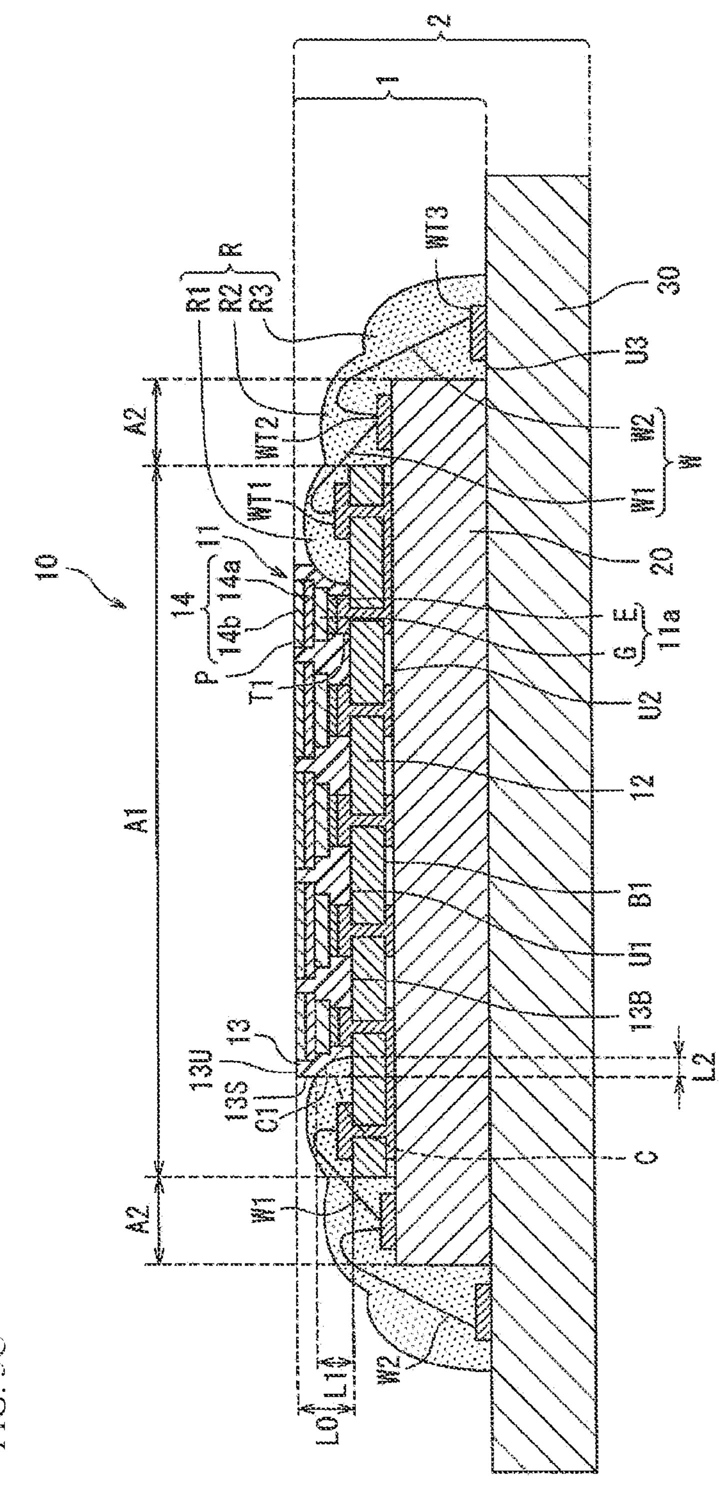
FIG. 3C is a schematic cross-sectional view taken along line IIIC-IIIC in FIG. 3A when viewed in an arrowed direction.

As illustrated in FIG. 3C, the upper surfaces of the first resin member R1, the second resin member R2, and the third resin member R3 may be curved. In the height direction, the highest position of the third resin member R3 may be lower than the highest position of the second resin member R2, and the highest position of the second resin member R2 may be lower than the highest position of the first resin member R1.

Flash Light-Emitting Module Incorporating Light-Emitting Module

Figure 4:
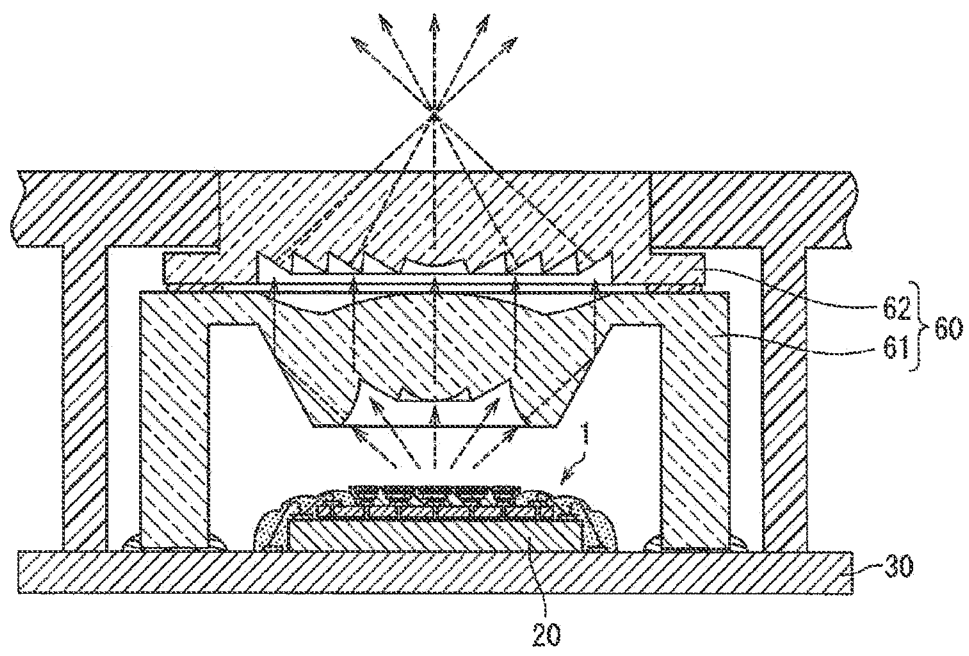
FIG. 4 is a schematic cross-sectional view illustrating a light-emitting module according to another embodiment of the present disclosure.

A flash light-emitting module incorporating the light-emitting module of the present embodiment is described below with reference to FIG. 4. In the flash light-emitting module of the present embodiment, the lens 60 is disposed above the light source 10. As an example, a first lens 61 may be provided on the light source 10, and a second lens 62 may be provided on the first lens 61. The second lens 62 is a Fresnel lens, for example. The Fresnel lens is disposed with a lower surface thereof having protrusions and recessions facing the light source 10 side, causing light emitted from the light source 10 to be incident on the lens and exit from a flat upper surface thereof. With use of the Fresnel lens, a thickness of the lens 60 can be reduced. In the light-emitting module 2 according to the present embodiment, because the light source 10 and the control unit 20 overlap each other in the height direction, a thickness of the light-emitting module tends to be thicker than the thickness of a light-emitting module in which the light source 10 and the control unit 20 are disposed separately. Therefore, by making the lens 60 or a part of the lens 60 into a Fresnel lens, thickening of the entire light-emitting module can be suppressed. This makes it possible to reduce the size of the light-emitting module 2.

Manufacturing Method of Light-Emitting Device

A manufacturing method of a light-emitting device according to an embodiment of the present disclosure is described below. The manufacturing method of the light-emitting device according to an embodiment of the present disclosure includes a step of preparing a light source, a step of preparing a control unit, a step of disposing the light source on the control unit, and a step of electrically connecting the light source and the control unit with a first wire. The manufacturing method of the light-emitting device according to an embodiment of the present disclosure may further include a step of disposing a first resin member after the step of electrically connecting the light source and the control unit by the first wire. The manufacturing method of the light-emitting device according to an embodiment of the present disclosure includes a first manufacturing method and a second manufacturing method. First, each step of the first manufacturing method is described with reference to FIGS. 5, 6A, 6B, 7A, 7B, 7C, 8A, 8B, 9A, 9B, 10A, 10B, 11A, 11B, 12, 13, 14, and 15.

First Manufacturing Method of Light-Emitting Device

Step of Preparing Light Source

The step of preparing the light source includes a step of disposing a plurality of light-emitting units on a first upper surface of a support substrate, and a step of disposing a light-reflective member covering the plurality of light-emitting units on the first upper surface of the support substrate.

Step of Disposing Plurality of Light-Emitting Units

Figure 5:
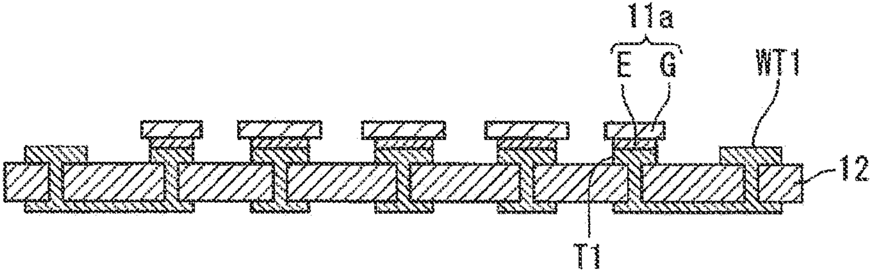
FIG. 5 is a schematic cross-sectional view for explaining a first manufacturing method of the light-emitting device according to the present disclosure.

First, as illustrated in FIG. 5, the light-emitting element 11*a* constituting the light-emitting unit 11 is prepared. The light-emitting element 11*a* includes the semiconductor structure G and the electrode E. Subsequently, the light-emitting elements 11*a* are disposed on the first terminal portions T1 of the support substrate 12, respectively. The electrodes E of the light-emitting elements 11*a* and the terminals of the first terminal portions T1 are electrically connected to each other via conductive members such as silver pastes, for example.

Figure 6A:
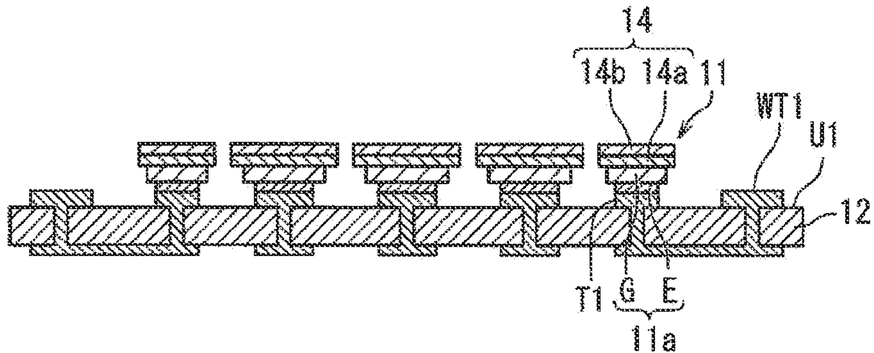
FIG. 6A is a schematic cross-sectional view for explaining the first manufacturing method of the light-emitting device according to the present disclosure.
Figure 6B:
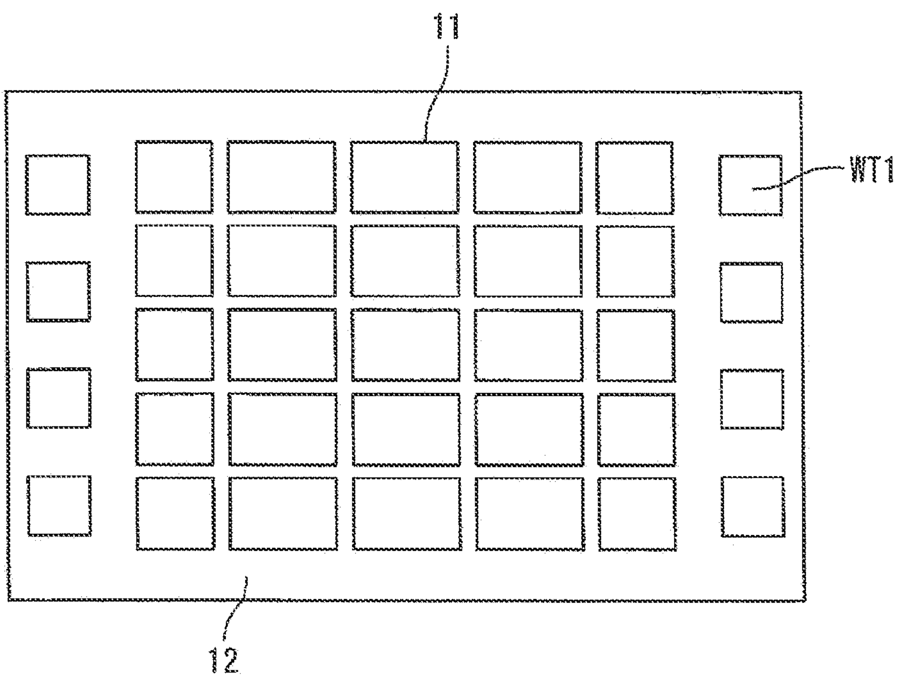
FIG. 6B is a schematic plan view for explaining the first manufacturing method of the light-emitting device according to the present disclosure.

Subsequently, as illustrated in FIGS. 6A and 6B, the light-transmissive member 14 is disposed on the light-emitting element 11*a*. The light-transmissive member 14 may include the wavelength conversion layer 14*a* and the light diffusion layer 14*b* as described above. The step of disposing the light-transmissive member 14 on the light-emitting element 11*a* includes a step of disposing an uncured bonding member on the upper surface of the light-emitting element 11*a*, a step of disposing the light-transmissive member 14 on the light-emitting element 11*a* via the uncured bonding member, and a step of bonding the light-emitting element 11*a* and the light-transmissive member 14 by curing or solidifying the uncured bonding member. The uncured bonding member is, for example, a resin member having transmissivity. In the manufacturing method according to the present embodiment, the light diffusion layer 14*b* contains a light diffusion member such as titanium dioxide, and the wavelength conversion layer 14*a* contains a wavelength conversion member such as a YAG phosphor. In a top view, the light-emitting unit 11 including the light-emitting element 11*a* and the light-transmissive member 14 is arrayed in a lattice shape on the support substrate 12 as illustrated in FIG. 6B. In the top view, the first wire-connecting portions WT1 are disposed in rows with the plurality of light-emitting units 11 interposed therebetween.

Step of Disposing Light-Reflective Member

The step of disposing the light-reflective member 13 includes a step of disposing a covering member S that covers the first wire-connecting portion WT1, a step of covering the covering member S and the plurality of light-emitting units 11 with the light-reflective member 13, and a step of removing the covering member S and forming the recess C1 in a region where the covering member S has been disposed. In the present specification, the term "light-reflective member" may be used for the light-reflective member 13 before and after the step of removing a part of the light-reflective member 13.

Figure 7A:
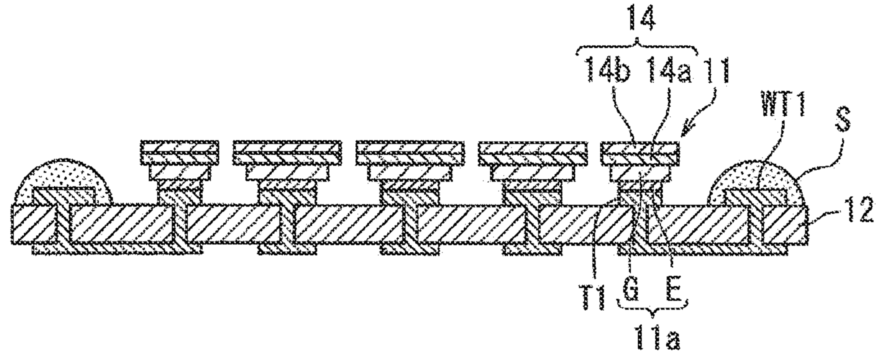
FIG. 7A is a schematic cross-sectional view for explaining the first manufacturing method of the light-emitting device according to the present disclosure.
Figure 7B:
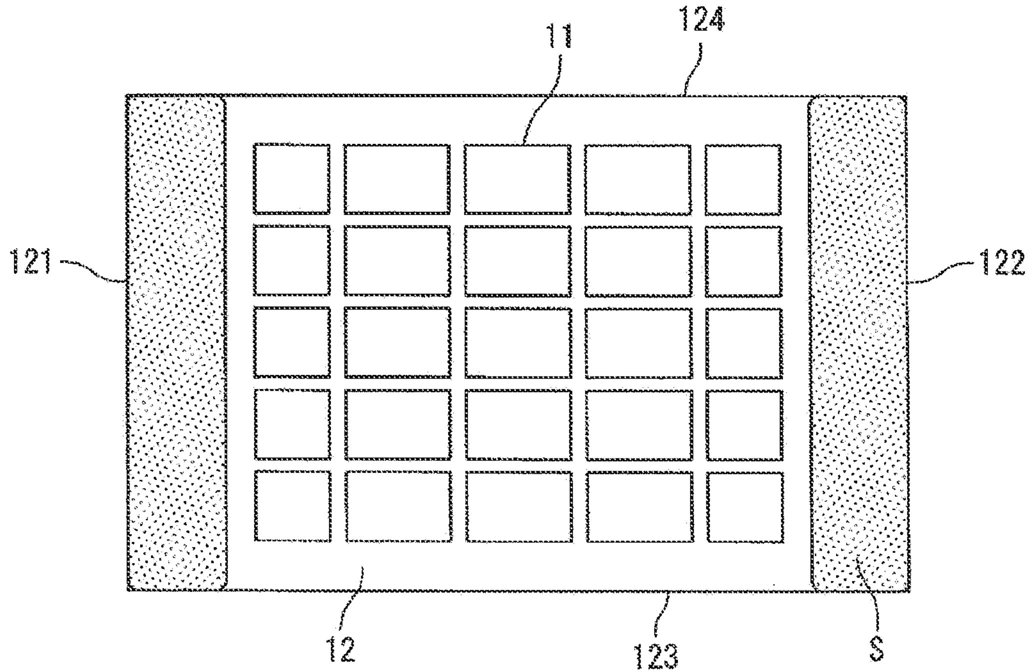
FIG. 7B is a schematic plan view for explaining the first manufacturing method of the light-emitting device according to the present disclosure.
Figure 7C:
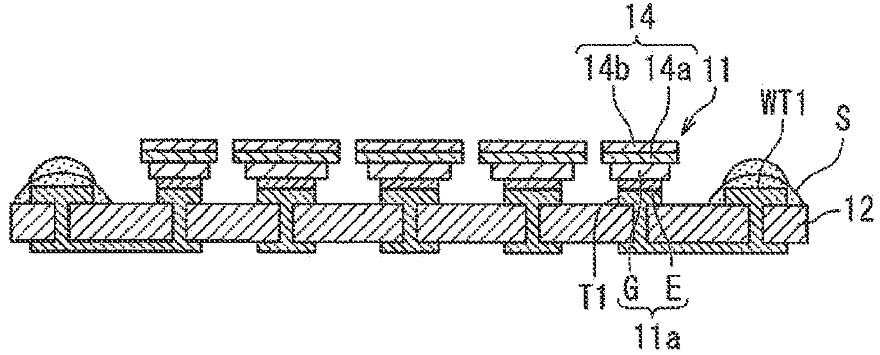
FIG. 7C is a schematic cross-sectional view for explaining a modified example of the first manufacturing method of the light-emitting device according to the present disclosure.

First, as illustrated in FIGS. 7A and 7B, one or more first wire-connecting portions WT1 are covered by the covering member S. The covering member S is a member for forming the recess C1 in the light-reflective member 13 in the step of disposing the light-reflective member 13, and is removed in a subsequent step. The covering member S is preferably, for example, a water-soluble member dissolvable with water. In the example illustrated in FIGS. 7A and 7B, the first wire-connecting portion WT1 is covered by a single-layer covering member S. Note that as illustrated in FIG. 7C, the first wire-connecting portion WT1 may be covered by a plurality of layers of covering members S. By disposing the covering member S with a plurality of layers, for example, the height, width of the depth, or width of the opening of the recess C1 provided in the light-reflective member 13 can be set to a desired size.

As a preferable aspect of the covering member S, the height of the covering member S is lower than the height of the light-emitting unit 11. By making the height of the covering member S lower than the height of the light-emitting unit 11, the recess C1 of the light-reflective member 13 can be shaped not to reach the upper surface of the light-reflective member 13. Thus, when a resin material to be the first resin member R1 to be described below is disposed in the recess C1, the resin material to be the first resin member R1 can be suppressed from reaching the light-emitting surface P of the light source 10. Note that the height of the covering member S may be higher than the height of the light-emitting unit 11. In this case, for example, as illustrated in FIGS. 2B and 2C, the recess C1 penetrating from the upper surface to the lower surface of the light-reflective member 13 can be formed.

As a more preferable aspect of the covering member S, the covering member S continuously covers all the first wire-connecting portions WT1 disposed in one row. In the manufacturing method according to the present embodiment, as illustrated in FIG. 7B, the covering member S is disposed on each of a first lateral surface 121 side and a second lateral surface 122 side of the support substrate 12. The covering members S disposed on the first lateral surface 121 side and the second lateral surface 122 side continuously cover all the first wire-connecting portions WT1 so as to reach both a third lateral surface 123 and a fourth lateral surface 124 in the top view. The width of the covering member S in a direction from the first lateral surface 121 toward the second lateral surface 122 is, for example, in a range from 1/15 times to 1/3 times, preferably in a range from 1/10 times to 1/3 times with respect to the maximum length of the support substrate 12. The width of the covering member S is, for example, in a range from 100 μm to 1000 μm, preferably in a range from 300 μm to 500 μm. By continuously covering all the first wire-connecting portions WT1 disposed in one row with the covering member S, the time required for the step of disposing the covering member S can be reduced as compared with a case in which the covering member S is individually disposed on each first wire-connecting portion WT1. Note that the position and shape of the covering member S can be changed in accordance with the shape of the recess C1 of the light-reflective member 13. For example, the covering member S may individually cover each of the first wire-connecting portions WT1.

Figure 8A:
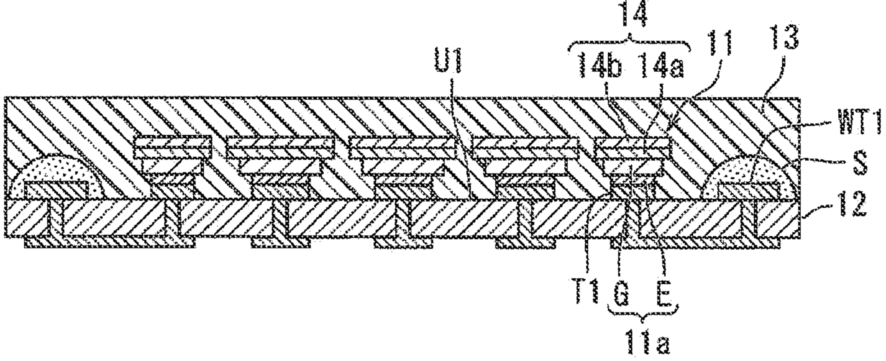
FIG. 8A is a schematic cross-sectional view for explaining the first manufacturing method of the light-emitting device according to the present disclosure.
Figure 8B:
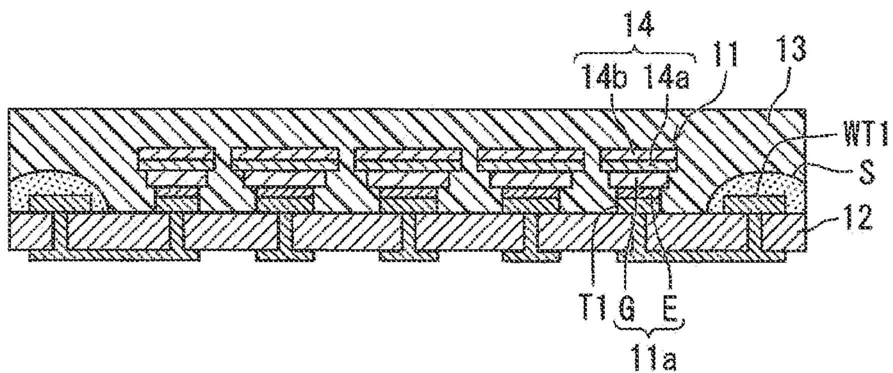
FIG. 8B is a schematic cross-sectional view for explaining a modified example of the first manufacturing method of the light-emitting device according to the present disclosure.

Subsequently, as illustrated in FIG. 8A, the light-reflective member 13 that covers the covering member S and the plurality of light-emitting units 11 is disposed. The light-reflective member 13 covers the upper surface and the lateral surface of each light-emitting unit 11, the upper surface of the covering member S, and a part of the first upper surface U1 of the support substrate 12. A part of the light-reflective member 13 is disposed between adjacent light-emitting units 11. The light-reflective member 13 can be disposed by, for example, compression molding using a mold. The light-reflective member 13 is, for example, a resin material containing a light-reflective material such as a white pigment. In the configuration illustrated in FIG. 8A, the light-reflective member 13 covers an entire surface of the covering member S. Note that as illustrated in FIG. 8B, the light-reflective member 13 may cover an upper portion of the covering member S, and a side portion of the covering member S may not be covered and may be exposed from the light-reflective member 13. When the recess C1 illustrated in FIG. 2B is formed, the light-reflective member 13 is provided so that the upper surface of the covering member S is exposed from the light-reflective member 13. Thus, the recess C1 penetrating from the upper surface to the lower surface of the light-reflective member 13 can be formed. When the recess C1 illustrated in FIG. 2C is formed, the light-reflective member 13 is provided so that the upper surface and a part of the lateral surface of the covering member S are exposed from the light-reflective member 13. Thus, the recess C1 that penetrates from the upper surface to the lower surface of the light-reflective member 13 and reaches the lateral surface of the light-reflective member 13 can be formed.

Figure 9A:
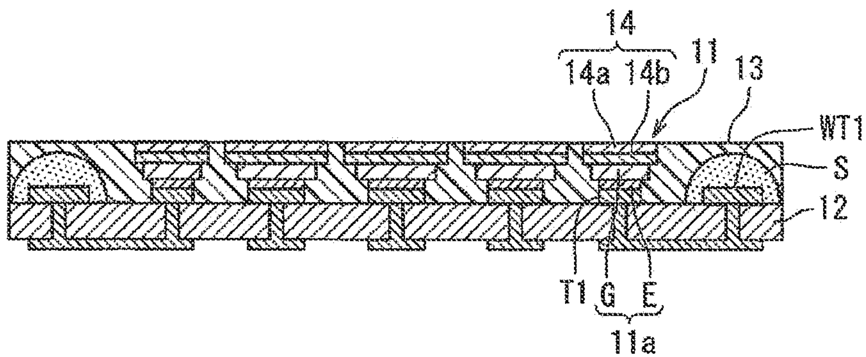
FIG. 9A is a schematic cross-sectional view for explaining the first manufacturing method of the light-emitting device according to the present disclosure.
Figure 9B:
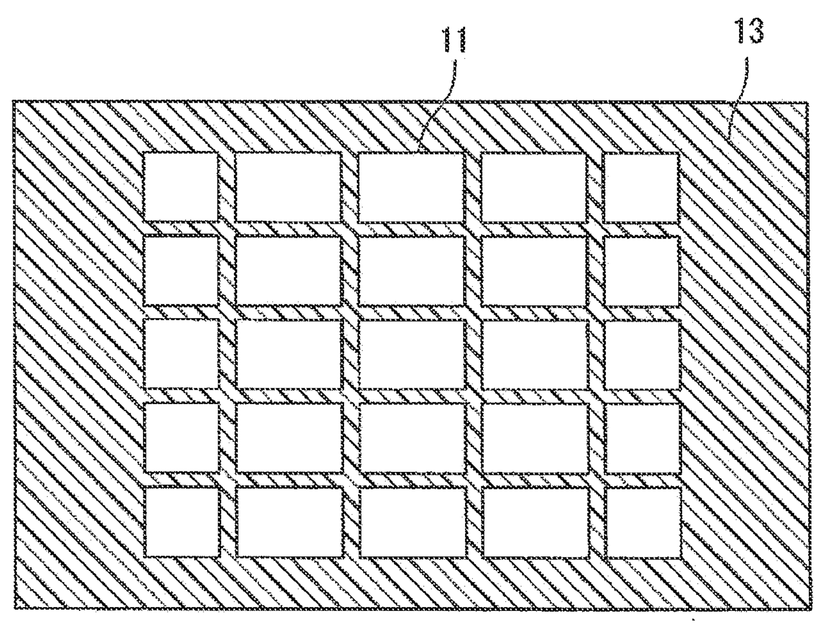
FIG. 9B is a schematic plan view for explaining the first manufacturing method of the light-emitting device according to the present disclosure.

Subsequently, as illustrated in FIGS. 9A and 9B, a part of the surface of the light-reflective member 13 is removed from the upper surface side to expose the light-emitting surface of each light-emitting unit 11 from the light-reflective member 13. The step of removing the light-reflective member 13 is performed using, for example, a grinding device. In the step of removing the light-reflective member 13, when the light-transmissive member 14 includes the wavelength conversion layer 14*a* and the light-diffusion layer 14*b*, it is preferable to remove a part of the light-diffusion layer 14*b* of the light-transmissive member 14 and not to remove the wavelength conversion layer 14*a*. By removing the light-reflective member 13 so that a part of the light diffusion layer 14*b* is removed, the light-emitting surface of each light-emitting unit 11 can be exposed from the light-reflective member 13 on the upper surface of the light-reflective member 13. On the upper surface of the light-reflective member 13, the upper surface of the light-reflective member 13 and the upper surface of the light diffusion layer 14*b* are located on the same plane. Because the wavelength conversion layer 14*a* is not removed, variations in the emission color of the light-emitting device 1 due to variations in the thicknesses of the wavelength conversion layer 14*a* can be reduced. Note that in the step of removing the light-reflective member 13, the light-reflective member 13 is preferably removed so that the covering member S is not removed as illustrated in FIGS. 9A and 9B. In other words, the upper surface of the light-reflective member 13 after grinding is preferably higher than the highest portion of the covering member S in the height direction. Thus, the recess C1 formed after the covering member S is removed can be shaped not to reach the upper surface of the light-reflective member 13. Note that in the step of removing the light-reflective member 13, a part of the upper surface of the covering member S may be removed together with the light-reflective member 13. Thus, for example, as illustrated in FIG. 2B, the recess C1 penetrating from the upper surface to the lower surface of the light-reflective member 13 can be formed.

Figure 10A:
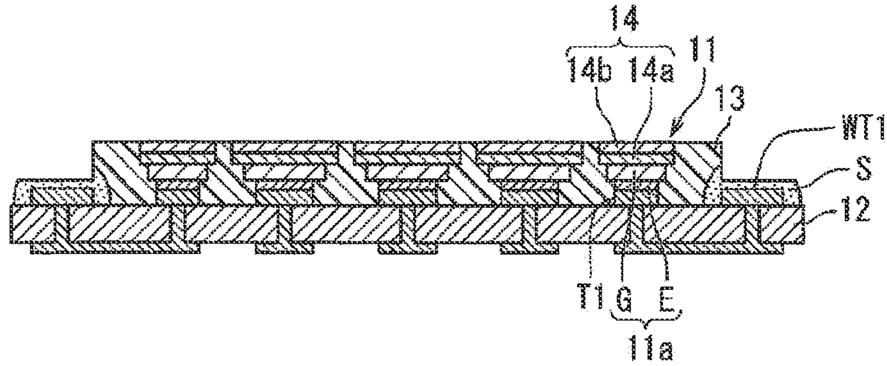
FIG. 10A is a schematic cross-sectional view for explaining the first manufacturing method of the light-emitting device according to the present disclosure.
Figure 10B:
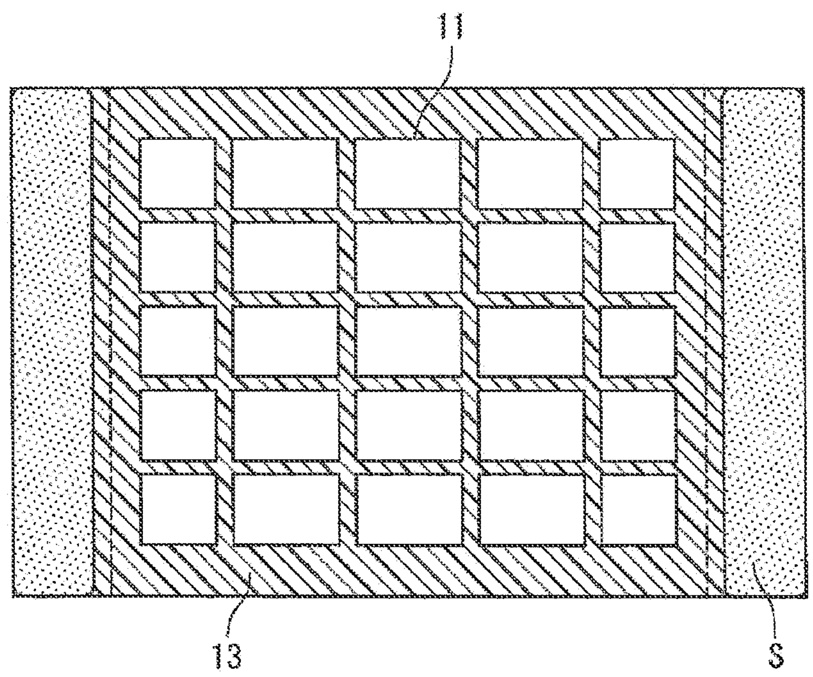
FIG. 10B is a schematic plan view for explaining the first manufacturing method of the light-emitting device according to the present disclosure.

Subsequently, as illustrated in FIGS. 10A and 10B, the light-reflective member 13 located above the covering member S and a part of the covering member S are removed. Thus, the covering member S is exposed from the light-reflective member 13 in the top view. The step of exposing the covering member S is performed using, for example, a cutting device using a dicing blade. In the step of exposing the covering member S, the removing step is preferably performed so that the covering member S is spaced from the first wire-connecting portion WT1 while removing a part of the upper portion of the covering member S. In other words, the removing step is preferably performed so that a part of the covering member S remains on the first wire-connecting portion WT1. This makes it possible to suppress the surface of the first wire-connecting portion WT1 from being damaged by the dicing blade or the like. This can reduce the possibility that the strength of connection between the first wire-connecting portion WT1 and the first wire WT1 is reduced due to damage on the surface of the first wire-connecting portion W1. By performing the step of exposing the covering member S, the outer lateral surface of the light-reflective member 13 forms the same plane as a part of the covering member S.

Figure 11A:
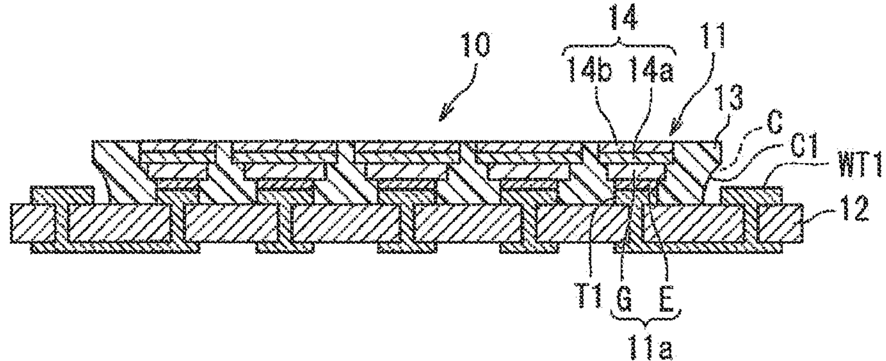
FIG. 11A is a schematic cross-sectional view for explaining the first manufacturing method of the light-emitting device according to the present disclosure.
Figure 11B:
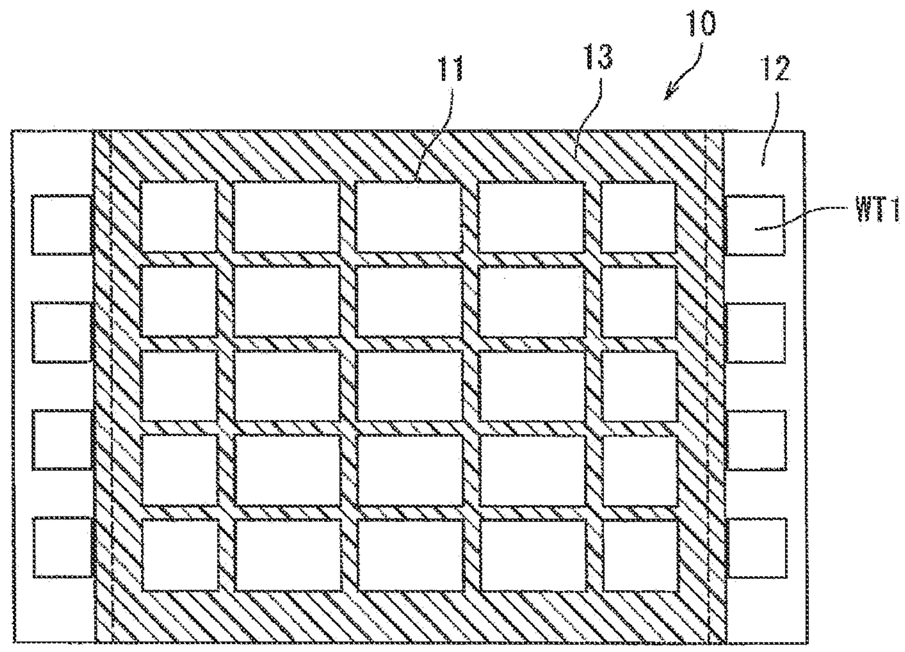
FIG. 11B is a schematic plan view for explaining the first manufacturing method of the light-emitting device according to the present disclosure.

Subsequently, as illustrated in FIGS. 11A and 11B, the covering member S is removed. The step of removing the covering member S includes, for example, removing the covering member S by dissolving the covering member S in an aqueous solution (as an example, water). For example, a structure manufactured through the above steps is immersed in a container containing an aqueous solution for 5 minutes to 3 hours, preferably 10 minutes to 1 hour. At this time, a step of applying vibration to the container may be further performed. Thus, the covering member S can be easily removed. By removing the covering member S, a space from which the covering member S is removed becomes the recess C1. The light-reflective member 13 including the recess C1 includes an upper surface, a lower surface located on the opposite side of the upper surface, an outer lateral surface connecting the upper surface and the lower surface, and the recess C1 provided in a part of the outer lateral surface on the lower surface side. The recess C1 includes an opening continuously provided on the lower surface and the outer lateral surface of the light-reflective member 13. In the top view, one or more first wire-connecting portions WT1 are exposed from the light-reflective member 13.

In the step of preparing the light source, the light source may be prepared by the above manufacturing method, or may be prepared by obtaining or any other means including purchase.

Step of Preparing Control Unit

Figure 12:
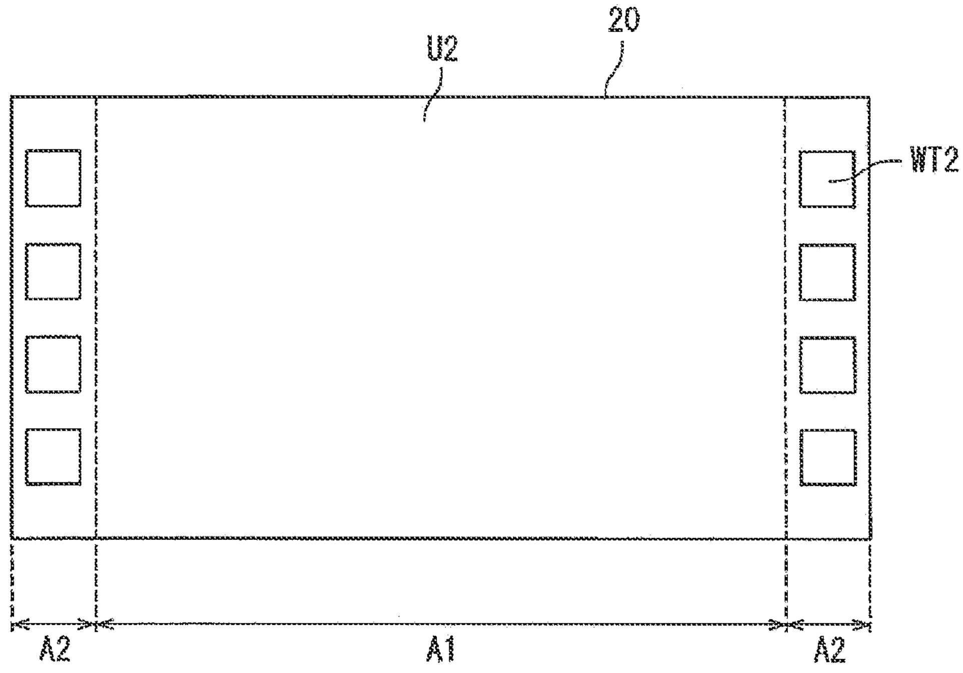
FIG. 12 is a schematic plan view for explaining the first manufacturing method of the light-emitting device according to the present disclosure.

Subsequently, the control unit 20 is prepared. The step of preparing the control unit may be performed before or after the step of preparing the light source, or may be performed simultaneously with the step of preparing the light source. As illustrated in FIG. 12, the control unit 20 includes an second upper surface U2, and is provided on the second upper surface U2 thereof with a first region A1 where the light sources 10 can be disposed and one or more second wire-connecting portions WT2 disposed in a second region A2 other than the first region A1. A plurality of the second wire-connecting portions WT2 are disposed in rows on the second region A2 with the first region A1 interposed therebetween. In the manufacturing method of the present embodiment, no wiring line is formed in the first region A1. In the step of preparing the control unit, the control unit 20 may be prepared by manufacturing, or may be prepared by obtaining or any other means including purchase.

Step of Disposing Light Source

Figure 13:
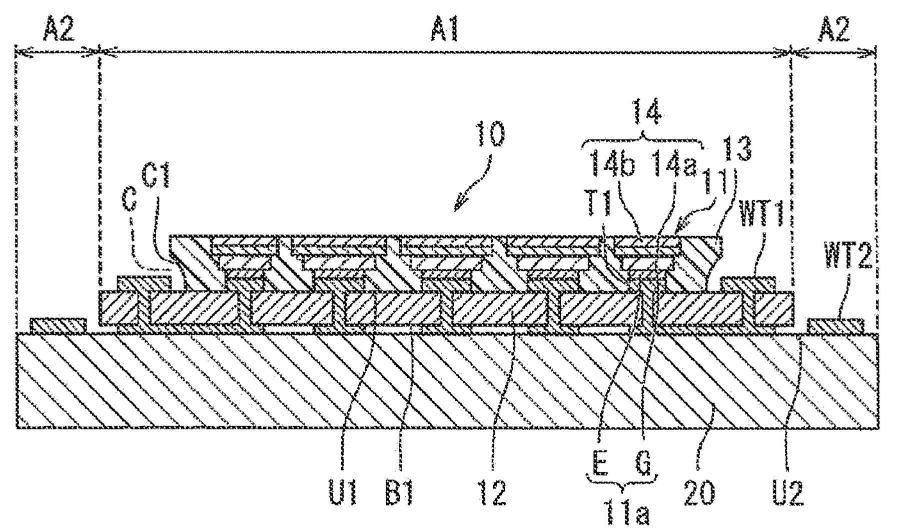
FIG. 13 is a schematic cross-sectional view for explaining the first manufacturing method of the light-emitting device according to the present disclosure.

Subsequently, as illustrated in FIG. 13, the light source 10 is disposed on the control unit 20. The light source 10 is disposed on the first region A1 on the second upper surface U2 of the control unit 20. For example, the light source 10 is bonded onto the first region A1 of the control unit 20 via a bonding member such as silver paste. Note that in this state, the light source 10 and the control unit 20 are not yet electrically connected to each other.

Step of Electrically Connecting by First Wire

Figure 14:
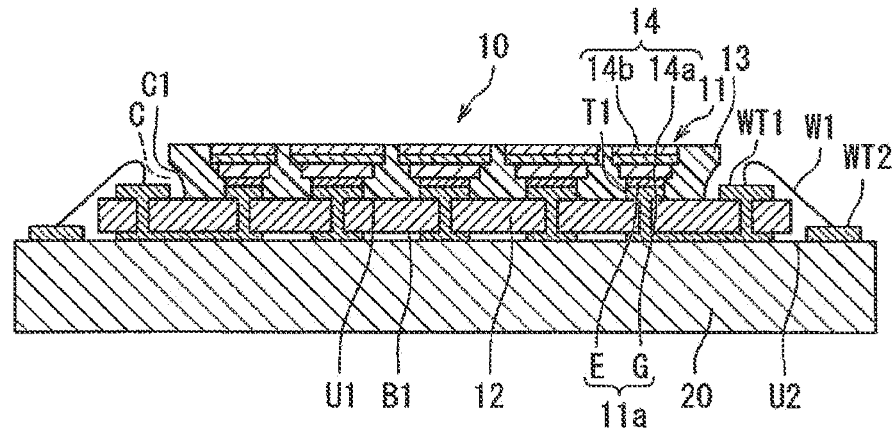
FIG. 14 is a schematic cross-sectional view for explaining the first manufacturing method of the light-emitting device according to the present disclosure.

Subsequently, the light source 10 and the control unit 20 are electrically connected to each other by the first wire W1. Specifically, as illustrated in FIG. 14, the first wire-connecting portion WT1 on the support substrate 12 and the second wire-connecting portion WT2 on the control unit 20 are connected by the first wire W1. Thus, current from the control unit 20 can be supplied to the light source 10 by the first wire W1. In the step of connecting by the first wire, one end of the first wire W1 may be connected to the first wire-connecting portion WT1, and then the other end of the first wire W1 may be connected to the second wire-connecting portion WT2. Note that the step of electrically connecting by the first wire may be performed after the step of disposing the light-emitting device 1 on the mounting substrate to be described below.

Step of Disposing First Resin Member

Figure 15:
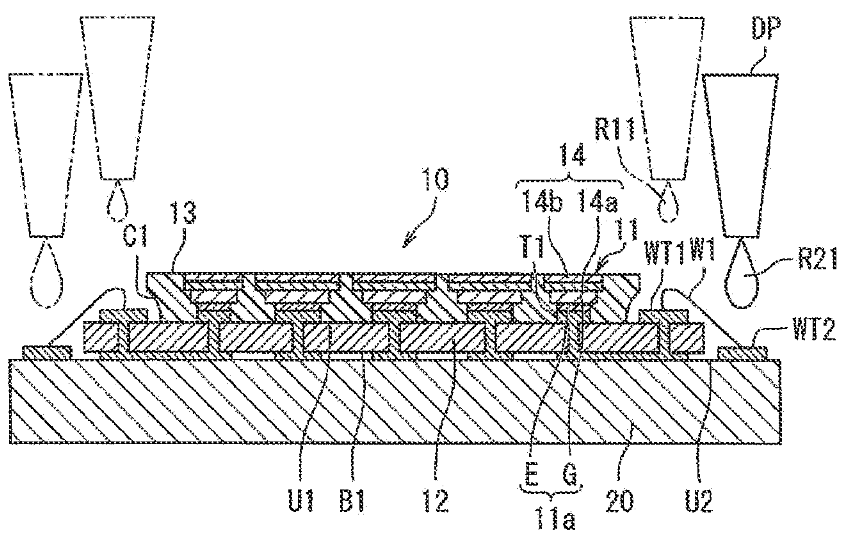
FIG. 15 is a schematic cross-sectional view for explaining the first manufacturing method of the light-emitting device according to the present disclosure.

The manufacturing method of the present embodiment may further include a step of disposing the first resin member. In the step of disposing the first resin member, the first resin member R1 enters the recess C1 of the light-reflective member 13 and covers the first wire-connecting portion WT1. As illustrated in FIG. 15, the step of disposing the first resin member includes a step of discharging and disposing an uncured first resin material R11 constituting the first resin member R1 from above the first wire-connecting portion WT1. The first resin material R11 covers the first wire-connecting portion WT1 and flows into the recess C1, so that a part of the first resin material R11 is disposed in the recess C1. Because the light-reflective member 13 includes the recess C1, the uncured first resin material R11 is likely to remain in the recess C1, so that creeping-up of the first resin material R11 up to the upper surface of the light-reflective member 13 can be suppressed. Thus, unintentional influence of the cured or solidified first resin member R1 on the orientation of the light source 10 can be suppressed. The uncured first resin material R11 constituting the first resin member R1 is discharged from, for example, a nozzle DP of a discharge device (for example, a dispenser) that discharges a resin material.

The first resin member R1 preferably covers the first wire W1. Because the first resin member R1 covers the first wire W1, for example, when an external force is applied to the light-emitting device 1, the first resin member R1 serves to protect the first wire W1, so that deformation or the like of the first wire W1 can be suppressed. Because the first resin member R1 has light reflectivity, a part of light emitted from the light source 10 toward the first wire W1 is reflected by the first resin member R1 and is easily extracted upward. Because the first resin member R1 covers the first wire W1, the first wire W1 is not easily visually recognized when the light-emitting device 1 is viewed from above, so that the appearance of the light-emitting device 1 can be improved. The first wire W1 may be covered by both the first resin member R1 and the second resin member R2 to be described below.

The first resin member R1 preferably covers all the first wire-connecting portions WT1 disposed in rows. That is, preferably, the nozzle DP of the discharge device continuously discharges the first resin material R11 while moving along the arrangement direction of the first wire-connecting portions WT1 disposed in rows. Thus, all the first wire-connecting portions WT1 can be collectively covered by the first resin material R11. Note that the first resin material R11 may be provided on the first wire-connecting portion WT1 by moving a workpiece in the discharge device in which the light-emitting device is disposed while the nozzle DP of the discharge device is fixed. The same applies to a second resin material R21 and a third resin material R31 to be described below.

Step of Disposing Second Resin Member

The manufacturing method of the present embodiment may further include a step of disposing a second resin member. In the step of disposing the second resin member, the second resin member R2 covers the second wire-connecting portion WT2 on the control unit 20. Note that the step of disposing the second resin member may be performed after or before the step of disposing the first resin member. As illustrated in FIG. 15, the step of disposing the second resin member includes a step of discharging and disposing an uncured second resin material R21 constituting the second resin member R2 from above the second wire-connecting portion WT2. The second resin member R2 preferably covers the first wire W1 together with the first resin member R1. Thus, the first wire W1 can be effectively protected from an external force.

The second resin member R2 preferably covers all the second wire-connecting portions WT2 disposed in rows. That is, preferably, the nozzle DP of the discharge device continuously discharges the second resin material R21 while moving along the arrangement direction of the second wire-connecting portions WT2 disposed in rows. Thus, all the second wire-connecting portions WT2 can be collectively covered by the second resin material R21.

The uncured first resin material R11 constituting the first resin member R1 and the uncured second resin material R21 constituting the second resin member R2 may be cured or solidified at the same time in a heating step or the like, or may be individually subjected to a curing step or a solidifying step. The two uncured resin materials are preferably cured or solidified at the same time. Thus, the time required for the curing step or the solidifying step can be shortened as compared with a case in which the curing step or the solidifying step is individually performed.

As a preferable discharge amount of the resin material, the discharge amount is increased in the order of the second resin material R21 and the first resin material R11. Because the discharge amount of the first resin material R11 is made less than the discharge amount of the second resin material R21, creeping-up of the first resin material R11 onto the light-emitting surface P of the light source 10 is easily reduced. Because the amount of the resin material covering the first wire-connecting portion WT1 close to the plurality of light-emitting units 11 is reduced, the thermal shock applied from the plurality of light-emitting units 11 to the vicinity of the first wire-connecting portion WT1 is easily reduced. Note that the step of disposing the first resin member R1 and the step of disposing the second resin member may be performed after a step of disposing the light-emitting device 1 on the mounting substrate to be described below.

Through the above steps, the light-emitting device of the present disclosure can be manufactured.

Manufacturing Method of Light-Emitting Module

A manufacturing method of the light-emitting module according to an embodiment of the present disclosure is described below. The manufacturing method of the light-emitting module according to an embodiment of the present disclosure includes a step of preparing a mounting substrate, a step of disposing the light-emitting device obtained by the above-described manufacturing method of the light-emitting device on a third upper surface of the mounting substrate, and a step of connecting a second wire-connecting portion on a control unit and the third wire-connecting portion on the mounting substrate with a second wire. Each step is described with reference to FIGS. 16 and 17.

Step of Preparing Mounting Substrate

First, the mounting substrate 30 is prepared. The mounting substrate 30 has a third upper surface U3, and includes one or more third wire-connecting portions WT3 on the third upper surface U3. The mounting substrate 30 is provided on the third upper surface U3 thereof with a region where the light-emitting device 1 is disposed and a region outside the region where the light-emitting device 1 is disposed. The one or more third wire-connecting portions WT3 are disposed in the region outside the region where the light-emitting device 1 is disposed. The third wire-connecting portions WT3 are disposed in rows with the region, where the light-emitting device 1 is disposed, interposed therebetween. The light-emitting device obtained by the above-described manufacturing method of the light-emitting device is disposed on the mounting substrate 30.

Step of Disposing Light-Emitting Device

Subsequently, the light-emitting device 1 is disposed on the mounting substrate 30. Specifically, the light-emitting device 1 is disposed on the third upper surface U3 of the mounting substrate 30 via a bonding member such as silver paste. Note that in this state, the light-emitting device 1 and the mounting substrate 30 are not yet electrically connected to each other.

Second Wire Connection Step

Figure 16:
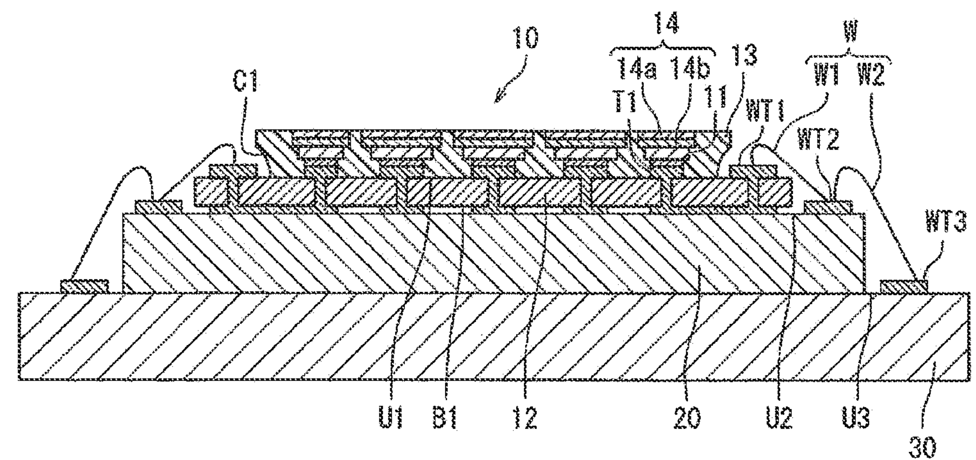
FIG. 16 is a schematic cross-sectional view for explaining a manufacturing method of a light-emitting module according to the present disclosure.

Subsequently, the light-emitting device 1 and the mounting substrate 30 are electrically connected to each other by the second wire W2. Specifically, as illustrated in FIG. 16, the second wire-connecting portion WT2 on the control unit 20 and the third wire-connecting portion WT3 on the mounting substrate 30 are electrically connected to each other by the second wire W2. Thus, current from the mounting substrate 30 can be supplied to the control unit 20 by the second wire W2. In the second wire connection step, one end of the second wire W2 may be connected to the second wire-connecting portion WT2, and then the other end of the second wire W2 may be connected to the third wire-connecting portion WT3. Alternatively, the first wire connection step may be performed immediately before the second wire connection step, to continuously perform the first wire connection step and the second wire connection step. Thus, for example, the two wire connection steps can be continuously performed in the same wire bonding apparatus. As a result, the time required for the wire connection step can be shortened. The first wire W1 and the second wire W2 may be continuous one wire. In this case, for example, wire bonding may be performed on the first wire-connecting portion WT1, the second wire-connecting portion WT2, and the third wire-connecting portion WT3 in this order, and the first wire-connecting portion WT1, the second wire-connecting portion WT2, and the third wire-connecting portion WT3 may be connected by one wire. Similarly, wire bonding may be performed on the third wire-connecting portion WT3, the second wire-connecting portion WT2, and the first wire-connecting portion WT1 in this order, and the first wire-connecting portion WT1, the second wire-connecting portion WT2, and the third wire-connecting portion WT3 may be connected by one wire.

Step of Disposing Third Resin Member

Figure 17:
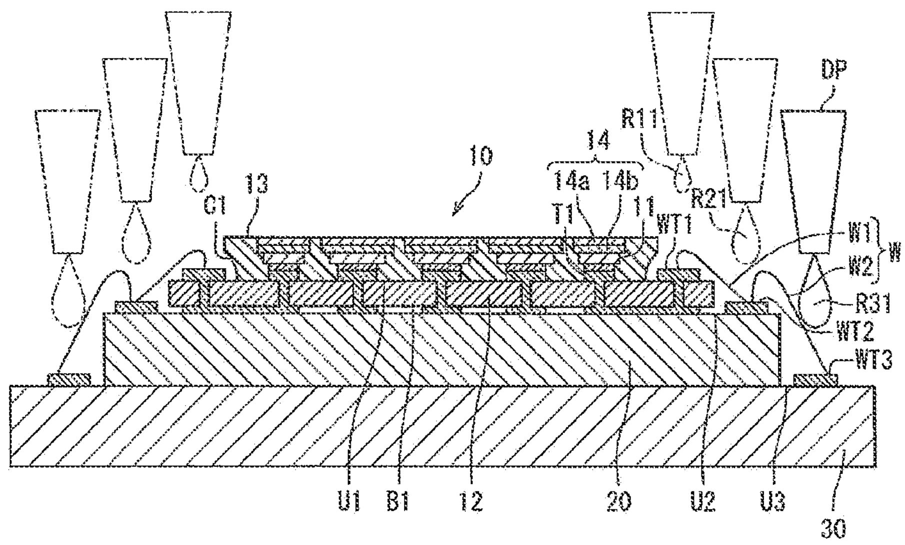
FIG. 17 is a schematic cross-sectional view for explaining the manufacturing method of the light-emitting module according to the present disclosure.

The manufacturing method of the present embodiment may further include a step of disposing a third resin member. In the step of disposing the third resin member, the third resin member R3 that covers the third wire-connecting portion WT3 is disposed. As illustrated in FIG. 17, the step of disposing the third resin member includes a step of discharging and disposing an uncured third resin material R3 constituting the third resin member R31 from above the third wire-connecting portion WT3. Similarly to the first resin material R11 and the second resin material R21, the uncured third resin material R31 may be provided using a discharge device (for example, a dispenser) that discharges a resin material. The third resin member R3 preferably covers the second wire W2. Because the third resin member R3 covers the second wire W2, for example, when an external force is applied to the light-emitting module 2, the third resin member R3 protects the second wire W2, so that deformation or the like of the second wire W2 can be suppressed. Note that the second wire W2 may be covered by both the second resin member R2 and the third resin member R3.

The step of disposing the first resin member and the step of disposing the second resin member may be performed during the step of preparing the light-emitting device, or may be performed continuously with the step of disposing the third resin member. The step of disposing the first resin member, the step of disposing the second resin member, and the step of disposing the third resin member are preferably performed continuously. Thus, for example, the steps of disposing the three resin members can be continuously performed in the same discharge device. As a result, the time required for the step of disposing the resin member can be shortened.

As a preferable discharge amount of the resin material, the discharge amount may be increased in the order of the third resin material R31, the second resin material R21, and the first resin material R11.

Second Manufacturing Method of Light-Emitting Device

Each step of a second manufacturing method of the light-emitting device according to an embodiment of the present disclosure is described below with reference to FIGS. 18, 19, 20, 21 and 22. The second manufacturing method is different from the above-described first manufacturing method in [step of preparing a light source]. Specifically, the second manufacturing method is different from the first manufacturing method in the step of disposing the light-reflective member. Therefore, in the following description, a step ([step of preparing a light source]) different from the first manufacturing method is mainly described, and description of common steps ([step of disposing a light source] and [step of covering with a resin material]) is appropriately omitted.

Step of Preparing Light Source

First, as illustrated in FIG. 6A, the support substrate 12 and the plurality of light-emitting units 11 disposed on the first upper surface U1 of the support substrate 12 are prepared in the same manner as in the first manufacturing method.

Subsequently, a light-reflective member that covers the plurality of light-emitting units 11 is disposed on the first upper surface U1 of the support substrate 12. In the second manufacturing method, the step of disposing the light-reflective member includes a step of immersing the plurality of light-emitting units 11 in an uncured light-reflective material 131 in a state in which the surface of the support substrate 12 on which the plurality of light-emitting units 11 are disposed and the uncured light-reflective material 131 face each other, and a step of curing or solidifying the uncured light-reflective material 131 to form the recess C1 in an outer peripheral portion of the obtained light-reflective member 13.

Figure 18:
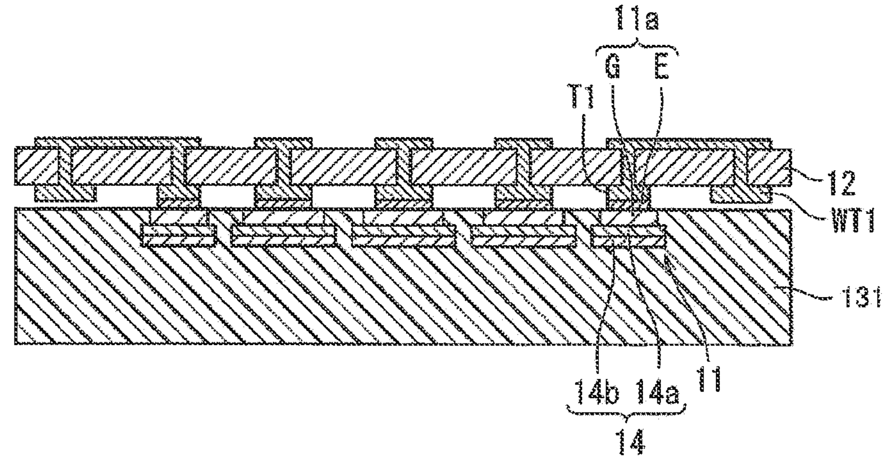
FIG. 18 is a schematic cross-sectional view for explaining a second manufacturing method of the light-emitting device according to the present disclosure.
Figure 19:
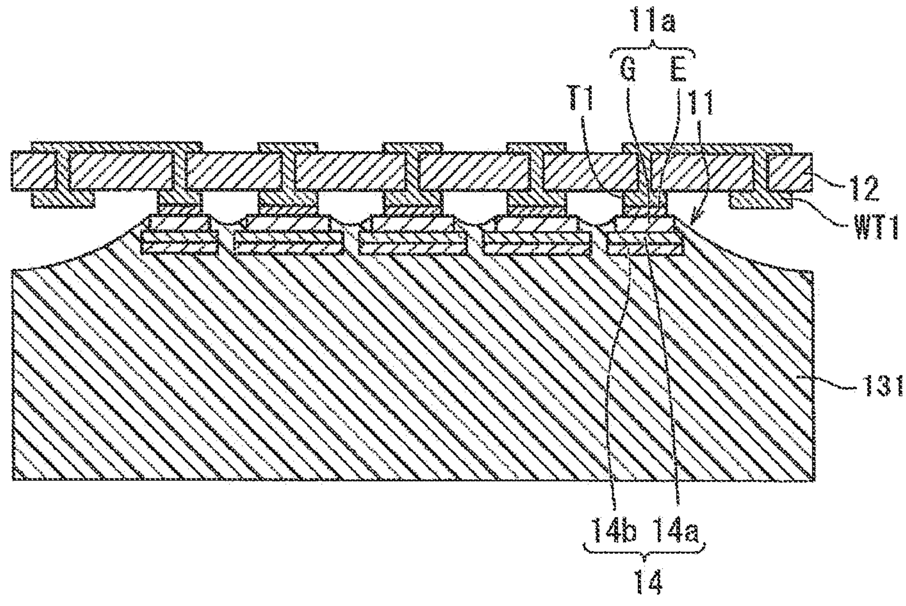
FIG. 19 is a schematic cross-sectional view for explaining the second manufacturing method of the light-emitting device according to the present disclosure.
Figure 20:
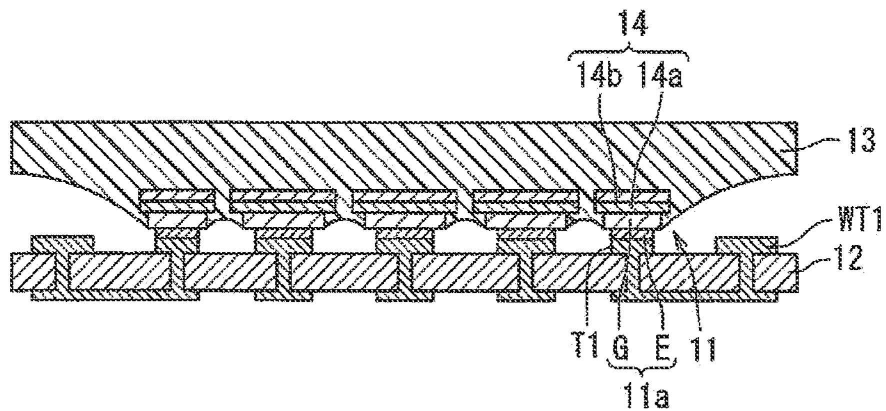
FIG. 20 is a schematic cross-sectional view for explaining the second manufacturing method of the light-emitting device according to the present disclosure.

First, as illustrated in FIG. 18, the plurality of light-emitting units 11 are immersed in the uncured light-reflective material 131 in the state in which the surface (first upper surface U1) of the support substrate 12 on which the plurality of light-emitting units 11 are disposed and the uncured light-reflective material 131 face each other. The immersion step is performed so that the light-reflective material 131 is spaced from the first upper surface U1 of the support substrate 12. Such immersion reduces the possibility that the first wire-connecting portion WT1 on the support substrate 12 is covered by the light-reflective material 131. As a result, the first wire W1 can be easily connected to the first wire-connecting portion WT1. Because the immersion step is performed so that the light-reflective material 131 is spaced from the first upper surface U1 of the support substrate 12, when the support substrate 12 is lifted upward as illustrated in FIG. 19, a recess is formed at an end of the light-reflective material 131 so that the light-reflective material 131 becomes thinner toward an outer lateral surface of the light-reflective material 131. In the present embodiment, in a direction orthogonal to the upper surface of the support substrate 12, the shortest distance between the end of the light-reflective material 131 and the first wire-connecting portion WT1 is greater than the shortest distance between the light-reflective material 131 located between the light-emitting units 11 and the support substrate 12. In the manufacturing method of the present embodiment, a recessed portion is also formed in the light-reflective material 131 located between adjacent light-emitting units 11. Subsequently, the light-reflective material 131 is cured or solidified by performing a heating step or the like. Thus, as illustrated in FIG. 20, the light-reflective member 13 that covers the plurality of light-emitting units 11 is formed.

Figure 21:
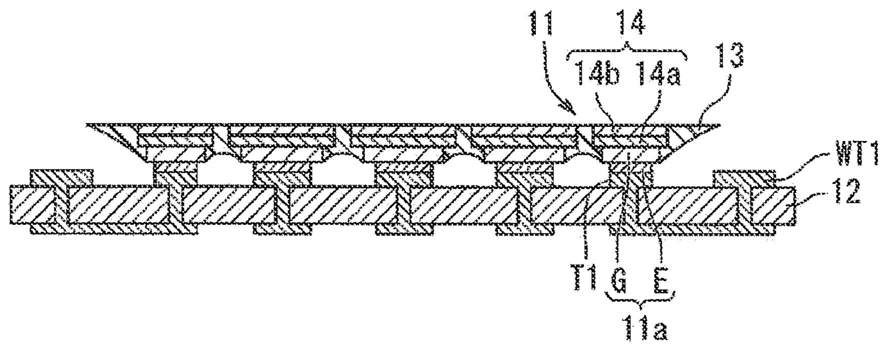
FIG. 21 is a schematic cross-sectional view for explaining the second manufacturing method of the light-emitting device according to the present disclosure.

Subsequently, as illustrated in FIG. 21, a part of the surface of the light-reflective member 13 is removed from an upper surface side to expose the light-emitting surface of each light-emitting unit 11 from the light-reflective member 13. The step of removing the light-reflective member 13 is performed using, for example, a grinding device. In the step of removing the light-reflective member 13, preferably, a part of the light diffusion layer 14*b* of the light-transmissive member 14 is removed and the wavelength conversion layer 14*a* is not removed, as in the first manufacturing method.

Figure 22:
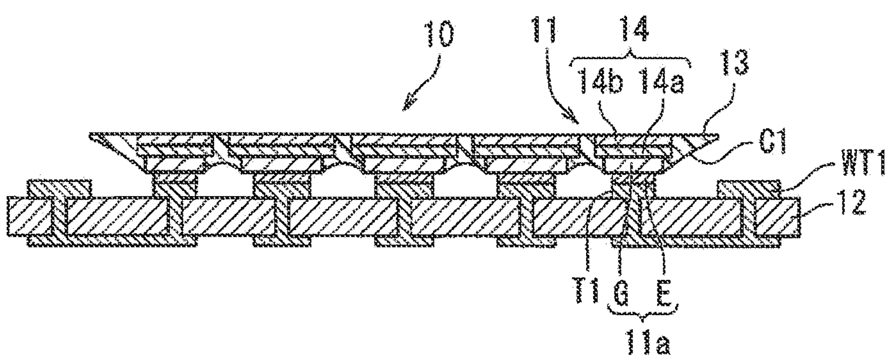
FIG. 22 is a schematic cross-sectional view for explaining the second manufacturing method of the light-emitting device according to the present disclosure.

Subsequently, as illustrated in FIG. 22, a part of the light-reflective member 13 located on the first wire-connecting portion WT1, the part being an end of the light-reflective member 13, is removed. The step of removing the part of the light-reflective member is performed using, for example, a cutting device using a dicing blade. By removing the part of the light-reflective member 13 located on the first wire-connecting portion WT1, a wire bonding step using the first wire W1 can be facilitated. The recess C1 is formed in the outer lateral surface of the light-reflective member 13. The light-reflective member 13 and the first wire-connecting portion WT1 are spaced from each other via the recess C1. Because the light-reflective member 13 is spaced from the first wire-connecting portion WT1 without covering the first wire-connecting portion W1, the first wire W1 can be easily connected to the first wire-connecting portion WT1.

Subsequently, the light-emitting device of the present disclosure can be manufactured through [the step of disposing the light source] and [the step of covering by the resin member] described in the first manufacturing method. Moreover, the light-emitting module of the present disclosure can be manufactured through the step of preparing the above-described mounting substrate, the step of disposing the light-emitting device obtained by the manufacturing method of the light-emitting device on the mounting substrate, and the step of connecting the control unit and the mounting substrate with the second wire.

The embodiments disclosed this time are illustrative in all respects and are not intended to be the basis of limiting interpretation. Accordingly, the technical scope of the present disclosure is not construed solely by the embodiments described above but is defined based on the description of the scope of claims. In addition, the technical scope of the present disclosure includes all variations within the meaning and scope equivalent to the scope of claims.

The invention claimed is:

1. A light-emitting device comprising:

a light source comprising:

a plurality of light-emitting units, a support substrate having a first upper surface, the support substrate comprising, on the first upper surface:

a plurality of first terminal portions electrically connected with respective ones of the light-emitting units, each of the plurality of first terminal portions comprising a plurality of terminals, and one or more first wire-connecting portions, and a light-reflective member covering the plurality of light-emitting units and comprising a recess in which the one or more first wire-connecting portions are exposed from the light-reflective member;

a control unit having a second upper surface and comprising, on the second upper surface:

a first region where the light source is disposed, and one or more second wire-connecting portions disposed in a second region other than the first region;

a first wire directly connected to one of the one or more first wire-connecting portions and directly connected to a respective one of the one or more second wire-connecting portions; and a first resin member located in the recess and covering at least said one of the one or more first wire-connecting portions.

2. The light-emitting device according to claim 1, wherein:

the first resin member does not reach a light-emitting surface of the light source.

3. The light-emitting device according to claim 1, wherein:

a plurality of the first wire-connecting portions are disposed in rows at positions facing each other with the plurality of first terminal portions interposed therebetween in a top view, and the first resin member continuously covers all the first wire-connecting portions disposed in the rows.

4. The light-emitting device according to claim 1, further comprising:

a second resin member covering at least said one of the one or more second wire-connecting portions.

5. The light-emitting device according to claim 1, wherein the light-reflective member has an upper surface, a lower surface located on an opposite side of the upper surface, and an outer lateral surface connecting the upper surface and the lower surface, and the recess of the light-reflective member comprises an opening provided continuously at the lower surface and the outer lateral surface of the light-reflective member.

6. A light-emitting module comprising:

the light-emitting device according to claim 1;

a mounting substrate having a third upper surface, the mounting substrate comprising, on the third upper surface:

a region where the light-emitting device is disposed, and one or more third wire-connecting portions disposed in a region other than the region; and a second wire directly connected to said one of the one or more second wire-connecting portions of the control unit and a respective one of the one or more third wire-connecting portions of the mounting substrate.

7. The light-emitting module according to claim 6, further comprising:

a third resin member covering the third wire-connecting portion.

* * * * *